US012684718B2

(12) United States Patent
Lee et al.

(10) Patent No.: US 12,684,718 B2
(45) Date of Patent: Jul. 14, 2026

(54) DISPLAY DEVICE

(71) Applicant: LG ELECTRONICS INC., Seoul (KR)

(72) Inventors: Kangyeung Lee, Seoul (KR); Sanghoon Kim, Seoul (KR); Hyunjin Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 47 days.

(21) Appl. No.: 18/658,368

(22) Filed: May 8, 2024

(65) Prior Publication Data

US 2025/0220834 A1 Jul. 3, 2025

(30) Foreign Application Priority Data

Dec. 28, 2023 (KR) ......................... 10-2023-0194047

(51) Int. Cl.
 *H05K 5/02* (2006.01)
 *F16M 11/12* (2006.01)
 *F16M 11/42* (2006.01)
(52) U.S. Cl.
 CPC ........... *H05K 5/0234* (2013.01); *F16M 11/12* (2013.01); *F16M 11/42* (2013.01); *F16M 2200/06* (2013.01); *F16M 2200/08* (2013.01)
(58) Field of Classification Search
 CPC .................................................. H05K 5/0234
 USPC ........................................ 361/807, 809, 810
 See application file for complete search history.

(56) References Cited

U.S. PATENT DOCUMENTS

| | | | |
|---|---|---|---|
| 6,305,659 B1 | 10/2001 | Metelski | |
| 6,446,930 B1 * | 9/2002 | Li | E04H 12/2238 |
| | | | 135/15.1 |
| 2005/0189005 A1 | 9/2005 | Smith et al. | |
| 2010/0219303 A1 | 9/2010 | Matsui et al. | |

FOREIGN PATENT DOCUMENTS

| | | | |
|---|---|---|---|
| KR | 20210032175 A * | 3/2021 | F16M 11/2014 |
| KR | 10-2023-0144976 | 10/2023 | |

OTHER PUBLICATIONS

Korean Intellectual Property Office Application No. 10-2023-0194047, Office Action dated Jul. 14, 2025, 5 pages.
European Patent Office Application Serial No. 24175093.4, Search Report dated Nov. 7, 2024, 8 pages.
Korean Intellectual Property Office Application No. 10-2025-0172505, Office Action dated Jan. 12, 2026, 7 pages.

* cited by examiner

*Primary Examiner* — Hung S. Bui
(74) *Attorney, Agent, or Firm* — LEE, HONG, DEGERMAN, KANG & WAIMEY

(57) ABSTRACT

A display device is provided. The display device according to the present disclosure may include: a display panel; and a stand supporting the display panel, wherein the stand may include: a base; and a pole connecting the base and the display panel, wherein the base may include: a case; a weight positioned in an internal space of the case; a recessed portion recessed toward the internal space of the case from a bottom of the case, the recessed portion covered by the weight and having a hole facing the weight; and a wheel assembly inserted into the recessed portion, and protruding downward from the bottom of the case, wherein the wheel assembly may include a wheel plate positioned at the hole of the recessed portion and coupled to the weight.

14 Claims, 22 Drawing Sheets

DISPLAY DEVICE

CROSS-REFERENCE TO RELATED APPLICATION

Pursuant to 35 U.S.C. § 119 (a), this application claims the benefit of earlier filing date and right of priority to Korean Patent Application No. 10-2023-0194047, filed on Dec. 28, 2023, the contents of which are all hereby incorporated by reference herein in their entireties.

BACKGROUND OF THE INVENTION

Field of the Invention

The present disclosure relates to a display device.

Description of the Related Art

With the development of the information society, there have been growing demands for various types of display devices, and in order to meet these demands, various display devices, such as a liquid crystal display (LCD), a plasma display panel (PDP), an electroluminescent display (ELD), a vacuum fluorescent display (VFD), an organic light emitting diode (OLED), etc., have been studied and used recently.

Among these devices, the LCD panel includes a TFT substrate and a color substrate which are positioned opposite each other with a liquid crystal layer interposed therebetween, and displays images by using light provided by a backlight unit. Further, the OLED panel may display images by using a self-emitting organic layer deposited on a substrate on which transparent electrodes are formed.

Recently, many studies are being conducted on a structure for freely moving a display device.

SUMMARY OF THE INVENTION

It is an objective of the present disclosure to solve the above and other problems.

Another object of the present disclosure may be to provide a display device including a stand for a display panel.

Another object of the present disclosure may be to provide a structure for freely moving a display device.

Another object of the present disclosure may be to provide a structure for improving standing stability and moving stability of a display device.

Another object of the present disclosure may be to provide a structure for reducing vibration of a moving display device.

Another object of the present disclosure may be to provide a structure for electrically connecting a base and a pole of a display device.

In accordance with an aspect of the present disclosure for achieving the above and other objectives, a display device may include: a display panel; and a stand supporting the display panel, wherein the stand may include: a base; and a pole connecting the base and the display panel, wherein the base may include: a case; a weight positioned in an internal space of the case; a recessed portion recessed toward the internal space of the case from a bottom of the case, the recessed portion covered by the weight and having a hole facing the weight; and a wheel assembly inserted into the recessed portion, and protruding downward from the bottom of the case, wherein the wheel assembly may include a wheel plate positioned at the hole of the recessed portion and coupled to the weight.

BRIEF DESCRIPTION OF THE DRAWINGS

The above and other objects, features and advantages of the present disclosure will be more apparent from the following detailed description in conjunction with the accompanying drawings, in which:

FIGS. 1 to 22 illustrate examples of a display device according to embodiments of the present disclosure.

DETAILED DESCRIPTION

Figure 1:
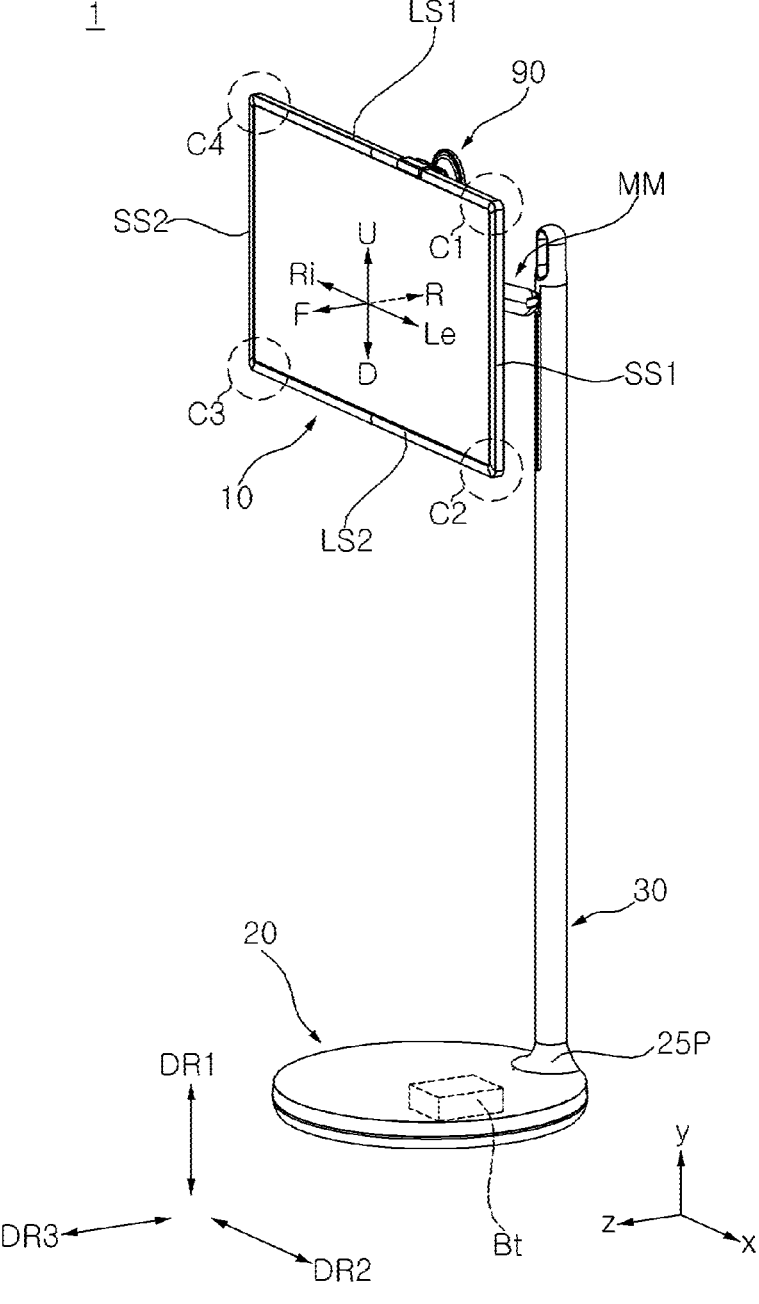

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms, "first," "second," etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

It should be understood that the terms, "comprise," "include," "have," etc. when used in this specification, specify the presence of stated features, integers, steps, operations, elements, components, or combinations thereof but do not preclude the presence or addition of one or more other features, integers, steps, operations, elements, components, or combinations thereof.

References to directions, such as up (U), down (D), left (Le), right (Ri), front (F), and rear (R), shown in the drawings are provided merely for convenience of explanation and are not intended for limiting the scope of the present disclosure.

Figure 2:
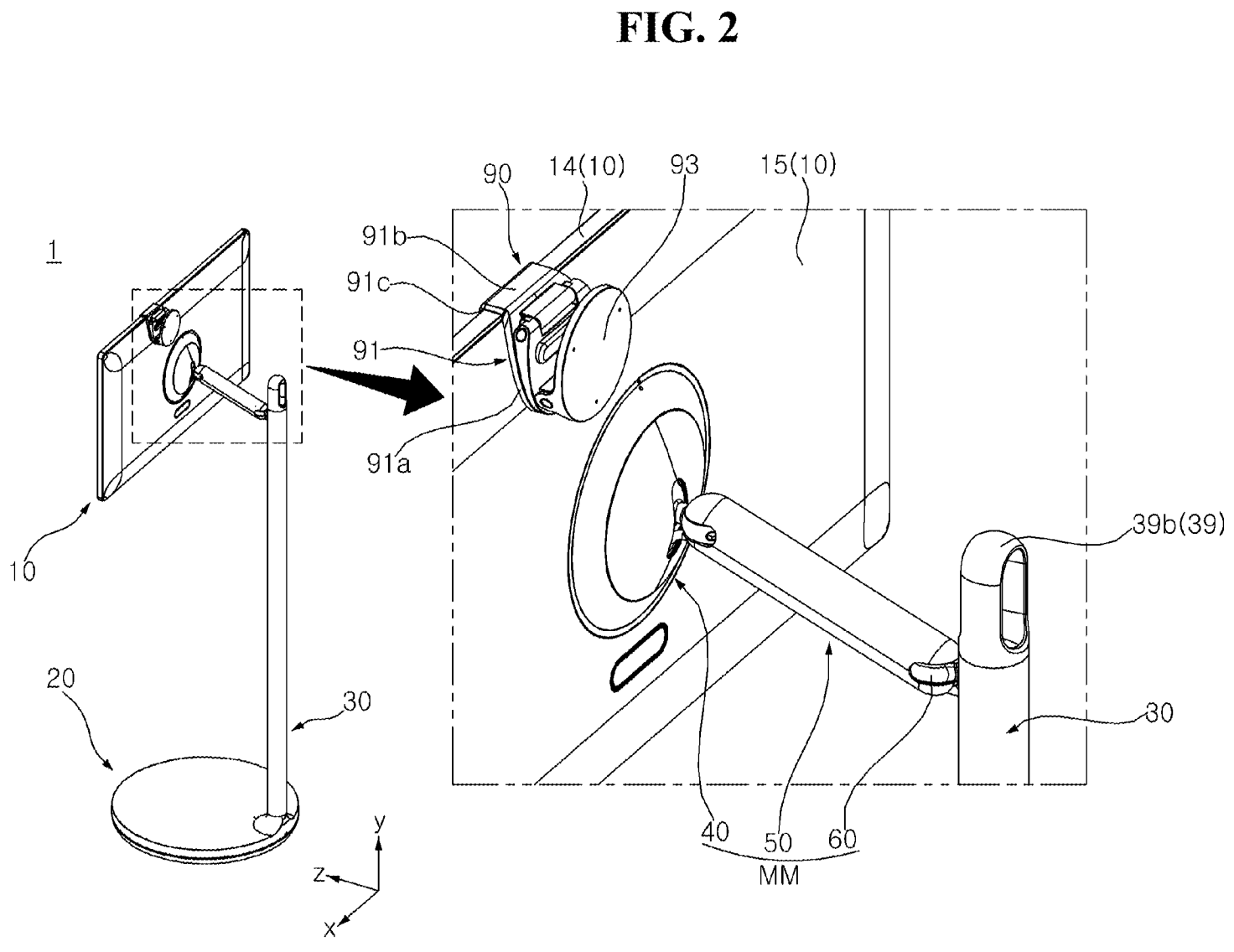

Referring to FIGS. 1 and 2, a display device 1 may include a head 10. The head 10 may display images. The head 10 may be referred to as a display 10 or a display unit 10.

The head 10 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the short sides SS1 and SS2 of the head 10 may be referred to as a first direction DR1 or an up-down direction. A direction parallel to the long sides LS1 and LS2 of the head 10 may be referred to as a second direction DR2 or a left-right direction. A direction perpendicular to the long sides LS1 and LS2 and the short sides SS1 and SS2 of the head 10 may be referred to as a third direction DR3 or a front-rear direction.

A side on which the head 10 displays an image may be referred to as a front side F, z, and a side opposite thereto may be referred to as a rear side R. The first short side SS1 may be referred to as a left side Le, x, and the second short side SS2 may be referred to as a right side Ri. The first long side LS1 may be referred to as an upper side U, y, and the second ling side LS2 may be referred to as a lower side D.

The first long side LS1, the second long side LS2, the first short side SS1, and the second short side SS2 may be referred to as edges of the head 10. A position where the first long side LS1 and the first short side SS1 meet each other may be referred to as a first corner C1. A position where the first short side SS1 and the second long side LS2 meet each other may be referred to as a second corner C2. A position where the second long side LS2 and the second short side SS2 meet each other may be referred to as a third corner C3. A position where the second short side SS2 and the first long side LS1 meet each other may be referred to as a fourth corner C4.

The display device 1 may include a base 20, a pole 30, and a motion module MM.

The base 20 may have a substantially flat cylindrical shape. The base 20 may be placed on the ground.

The pole 30 may extend vertically. A lower end of the pole 30 may be coupled to the base 20. The pole 30 may be adjacent to a rim of the base 20.

The motion module MM may extend in a direction intersecting the pole 30. A first side of the motion module MM may be adjacent to the upper end of the pole 30 and may be coupled to the pole 30. A second side of the motion module MM may be coupled to the head 10. The motion module MM may include a front connector 40, an arm 50, and a rear connector 60. The front connector 40 may be disposed at the rear of the head 10 and coupled to the head 10, and may be an articulated connector. The rear connector 60 may be disposed at the front of the pole 30 and coupled to the pole 30, and may be an articulated connector. The arm 50 may connect the front connector 40 and the rear connector 60, and may be rotatably coupled to the front connector 40 and the rear connector 60. That is, both sides of the motion module MM may rotate relative to the rotating head 10 or the pole 30. Alternatively, at least one of the both sides of the motion module MM may be fixed to the head 10 or the pole 30.

Accordingly, the head 10 may be supported by the motion module MM, the pole 30, and the base 20, and may be spaced above the ground. The base 20, the pole 30, and the motion module MM may be collectively referred to as a stand. Alternatively, the motion module MM may be omitted, in which case the head 10 may be coupled to the pole 30.

A battery Bt may be placed in the base 20, the pole 30, the motion module MM, and/or the head 10, and may be charged by an external power source. The display device 1, disconnected from the external power source, may be driven by the power of the battery Bt.

Figure 3:
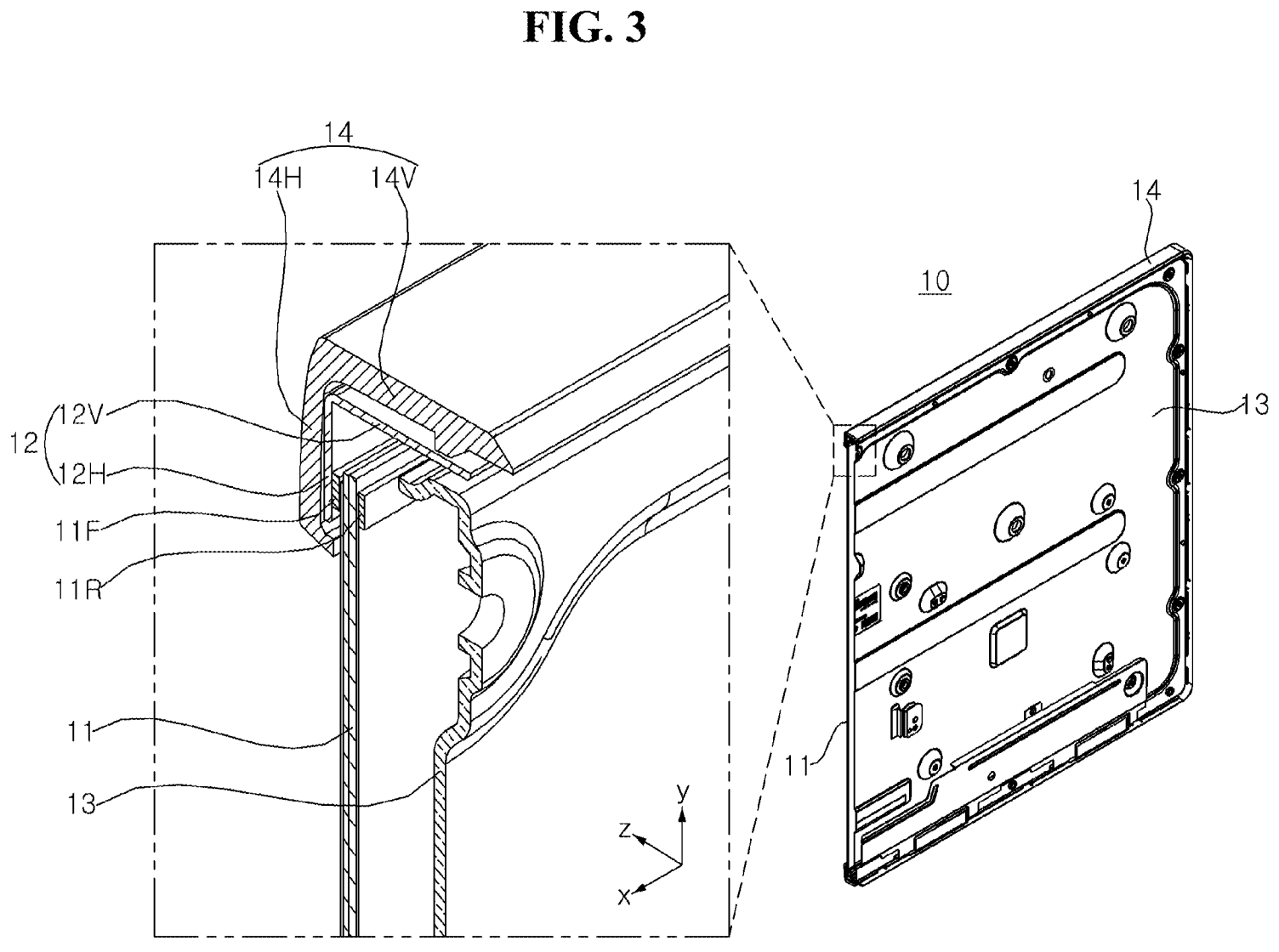

Referring to FIGS. 2 and 3, the head 10 may include a display panel 11, a guide panel 12, a frame 13, an end frame 14, and a back cover 15.

The display panel 11 may form a front surface of the head 10. For example, the display panel 11 may be an OLED panel, an LCD panel, or an LED panel. The display panel 11 may divide an image into a plurality of pixels and may output the image while controlling color, brightness, and chroma of the respective pixels. The display panel 11 may be divided into an active area, in which the image is displayed, and a de-active area in which the image is not displayed. The display panel 11 may generate light corresponding to red, green, or blue color in response to a control signal.

The guide panel 12 may extend along a periphery of the display panel 11. The guide panel may cover a side surface of the display panel 11.

The frame 13 may be disposed at the rear of the display panel 11. Electronic components, such as a Printed Circuit Board (PCB), may be coupled to a rear surface of the frame 13. For example, a power supply board, a main board, a timing controller board, and a speaker may be mounted on a rear surface of the frame 13.

The end frame 14 may extend along the guide panel 12. The end frame 14 may cover a side surface of the end frame 14, and may form a periphery of the head 10.

The back cover 15 may be disposed at the rear of the frame 13. The back cover 15 may cover the frame 13 and may form a rear surface of the head 10.

Figure 4:
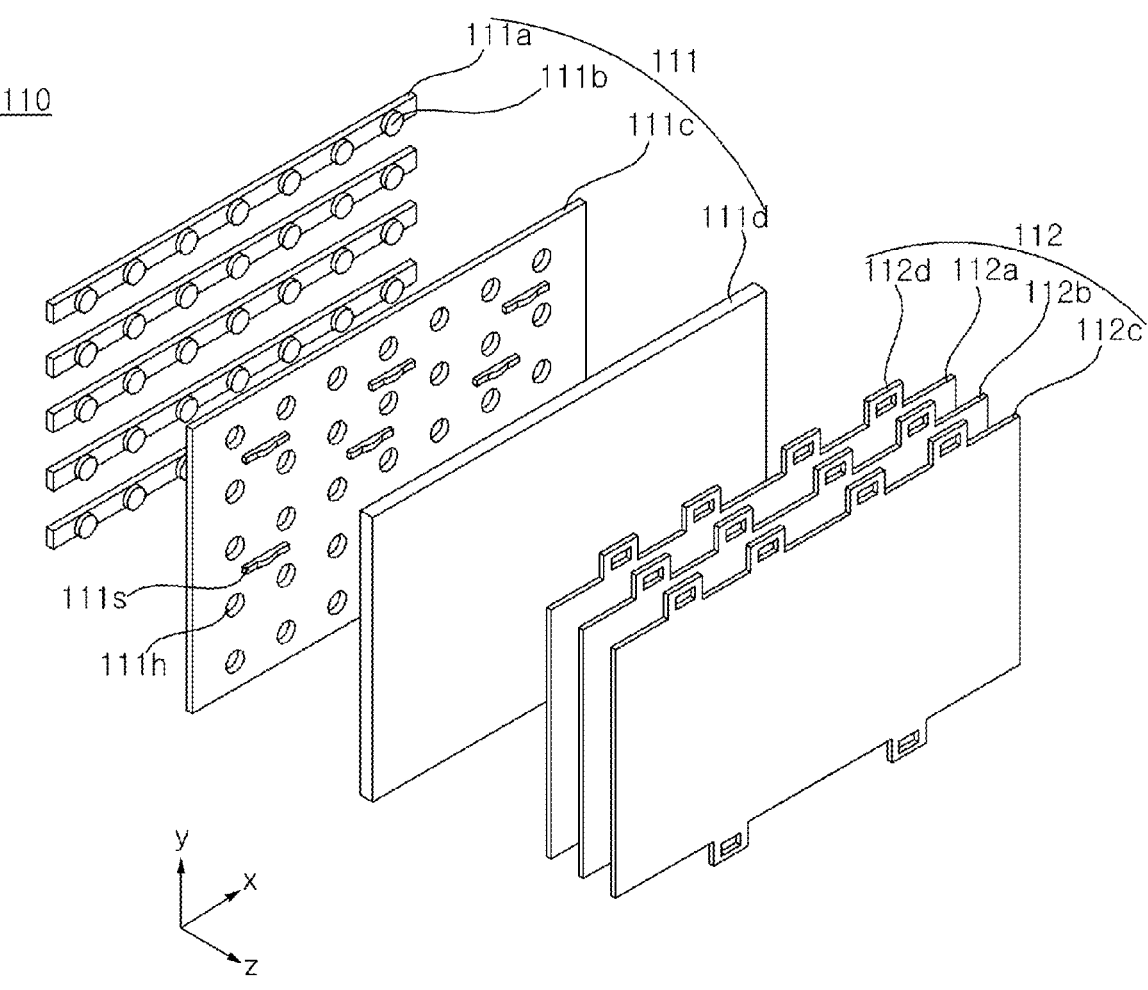
Figure 5:
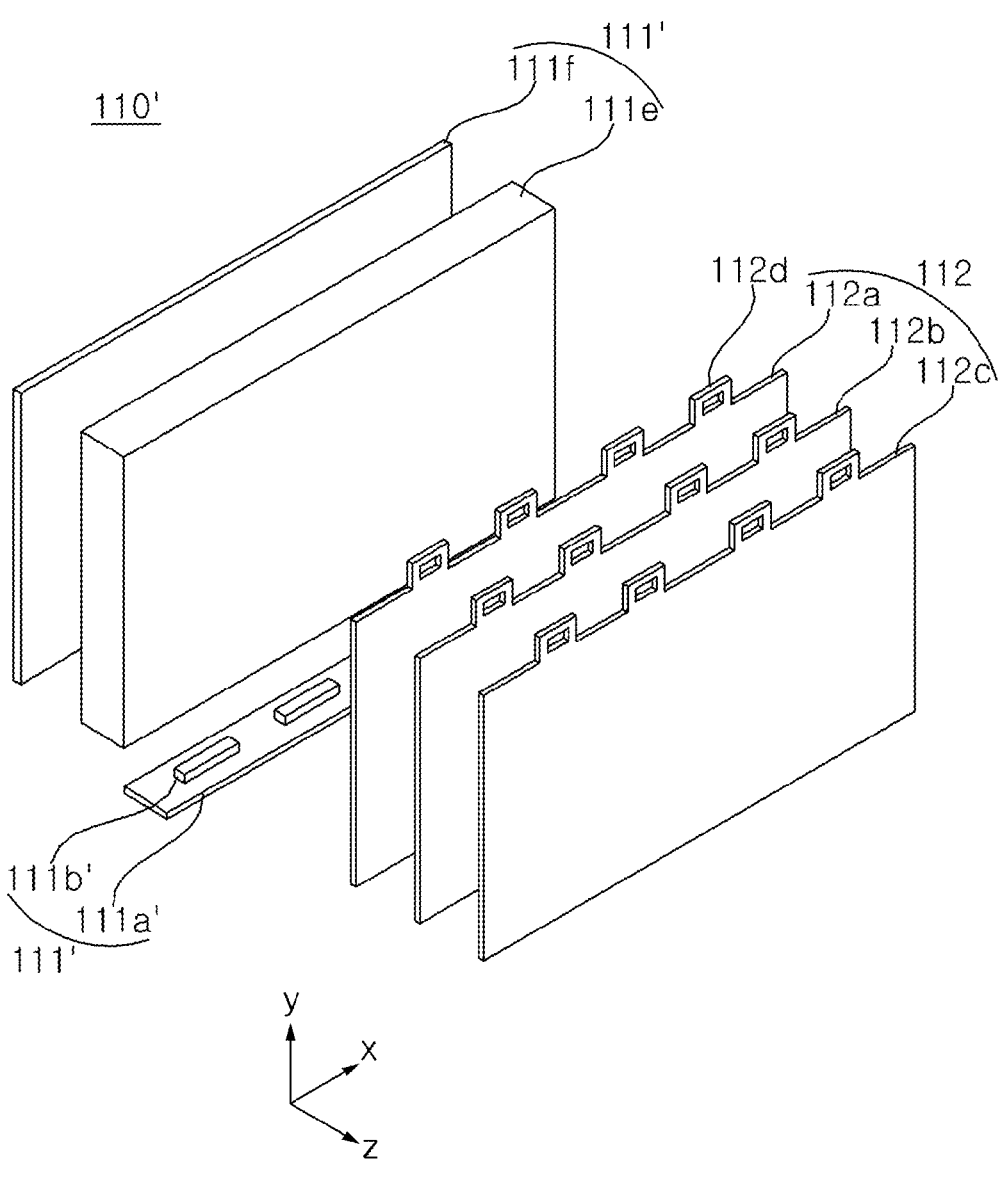

Referring to FIGS. 4 and 5, a backlight unit 110; 110' may be mounted to the frame 13 (see FIG. 3) and may provide light to the display panel 11 (see FIG. 3). In this case, the display panel 11 may be referred to as an LCD panel. The backlight unit 110; 110' may include an optical layer 111 and an optical sheet 112.

The optical layer 111 may include a substrate 111a, light sources 111b, a reflective sheet 111c, and a diffusion plate 111d (see FIG. 4). The substrate 111a may be coupled to a front surface of the frame 13 (see FIG. 3). The substrate 111a may have a plate shape or may be in the form of a plurality of bars which are spaced apart from each other. The light sources 111b may be mounted on the substrate 111a and may be light emitting diodes (LEDs). The reflective sheet 111c may cover the substrate 111a, and may have holes 111h in which the light sources 111b are disposed. The diffusion plate 111d may be spaced forward from the reflective sheet 111c. A spacer 111s may be disposed on a front surface of the reflective sheet 111c and may support a rear surface of the diffusion plate 111d.

Alternatively, an optical layer 111' may include a substrate 111a', light sources 111b', a light guide plate 111e, and a reflective sheet 111f (see FIG. 5). The substrate 111a' may be disposed adjacent to one side of the light guide plate 111e and may extend along the one side. The light sources 111b' may be mounted on the substrate 111a' and may be light emitting diodes (LEDs). The reflective sheet 111f may be disposed at the rear of the light guide plate 111e.

The optical sheet 112 may be disposed at the front of the diffusion plate 111d or the light guide plate 111e. The optical sheet 112 may include a plurality of sheets 112a, 112b, and 112c. Light may be provided to the display panel 11 (see FIG. 3) through the optical sheet 112.

The display panel 11 according to the present disclosure may be an OLED panel that does not require the above backlight unit 110; 110' or may be another type of panel.

Figure 6:
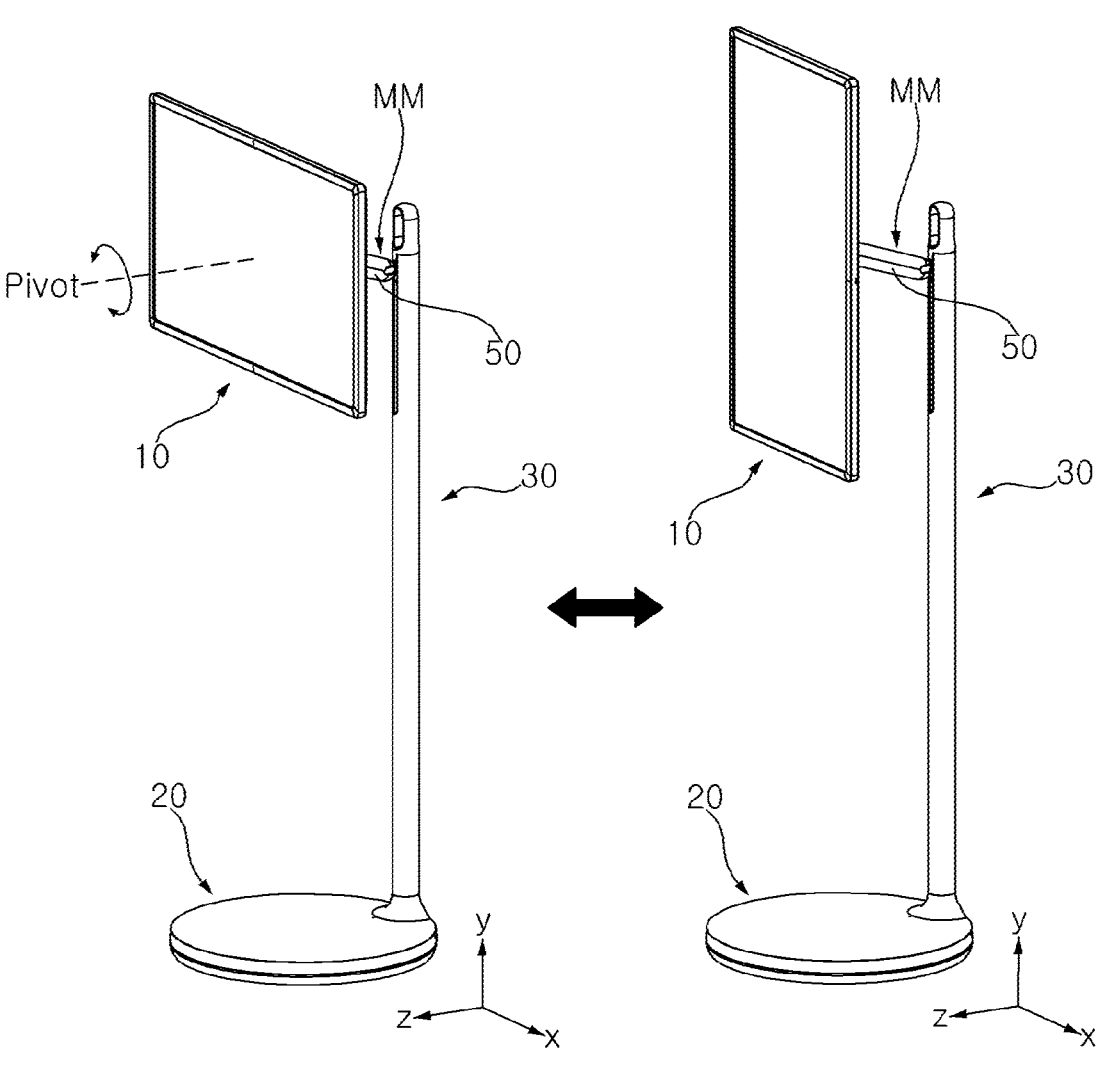

Referring to FIG. 6, a user may pivot the motion module MM relative to the head 10. A pivot axis may pass through the center of the head 10 and may be orthogonal to the head 10. Referring to the left drawing of FIG. 6, the head 10 may be positioned in a horizontal mode. Referring to the right drawing of FIG. 6, the head 10 may be positioned in a vertical mode.

Figure 7:
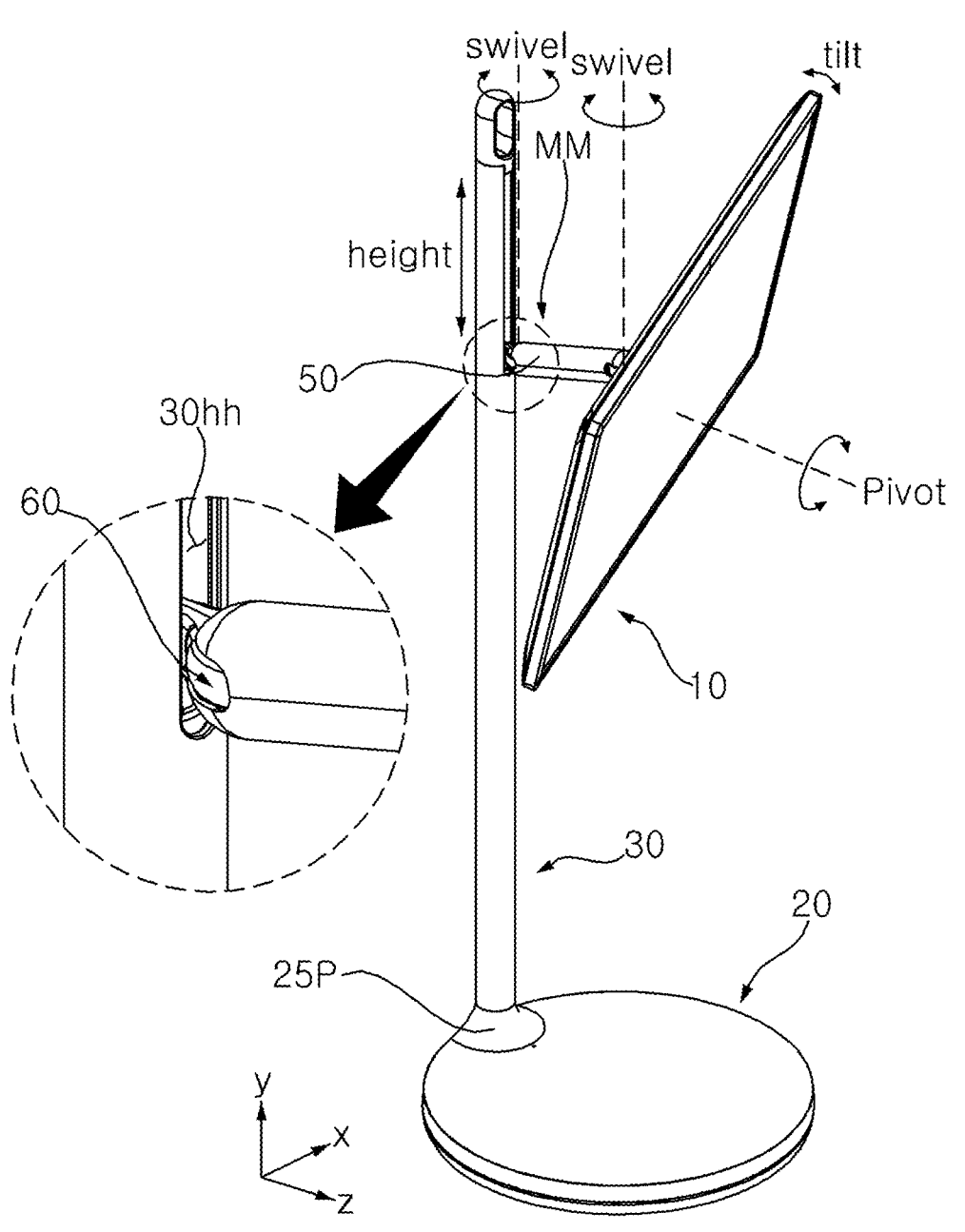

Referring to FIG. 7, a user may tilt the head 10 relative to the motion module MM. A tilt axis is located behind the center of the head 10, and may be a horizontal axis parallel to the head 10. The user may swivel the head 10 relative to the motion module MM, and a swivel axis may be a vertical axis adjacent to a front end of the motion module MM. The user may swivel the head 10 relative to the motion module MM, and a swivel axis may be a vertical axis adjacent to a rear end of the motion module MM. The user may raise or lower the head 10 along the pole 30.

Figure 8:
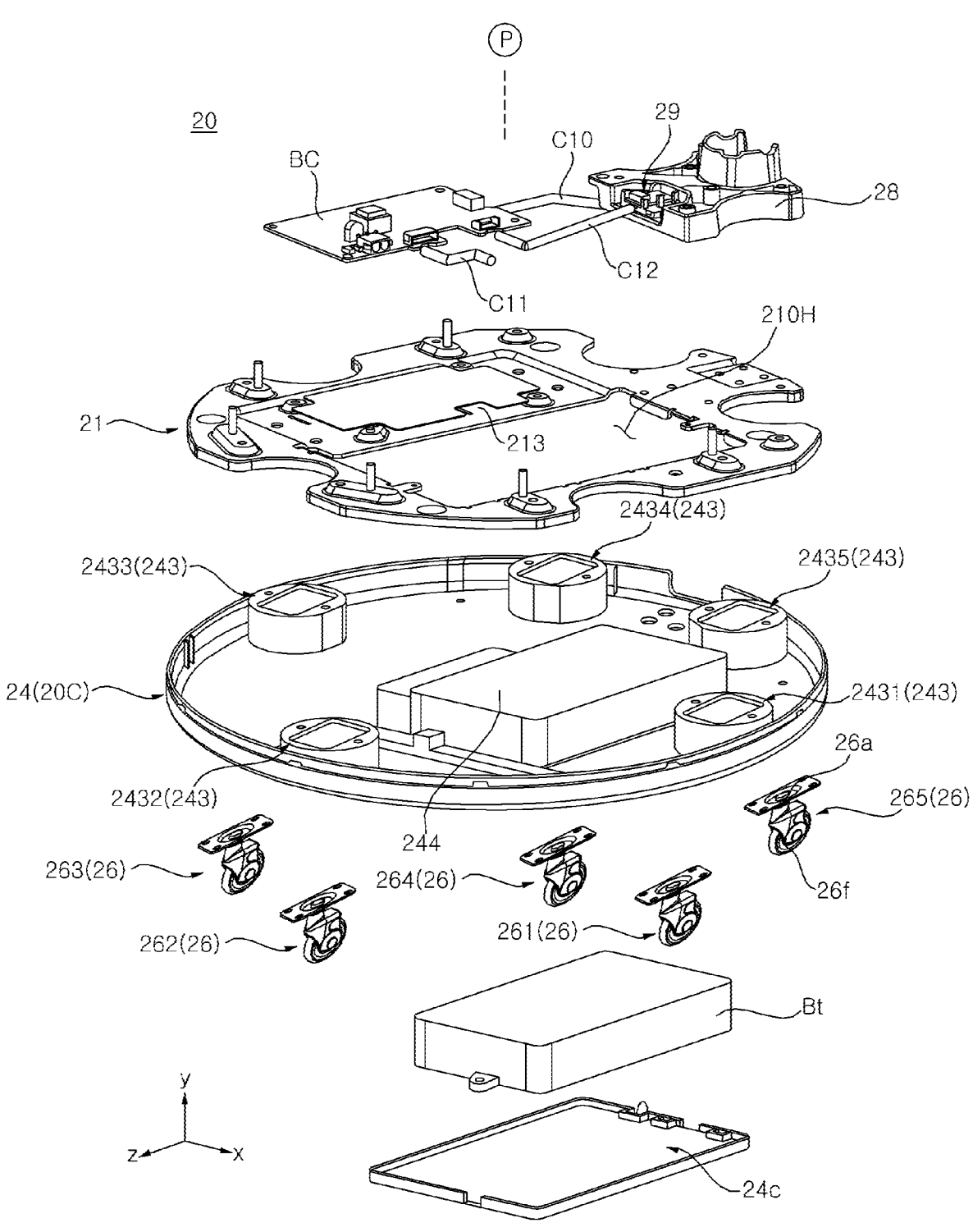
Figure 9:
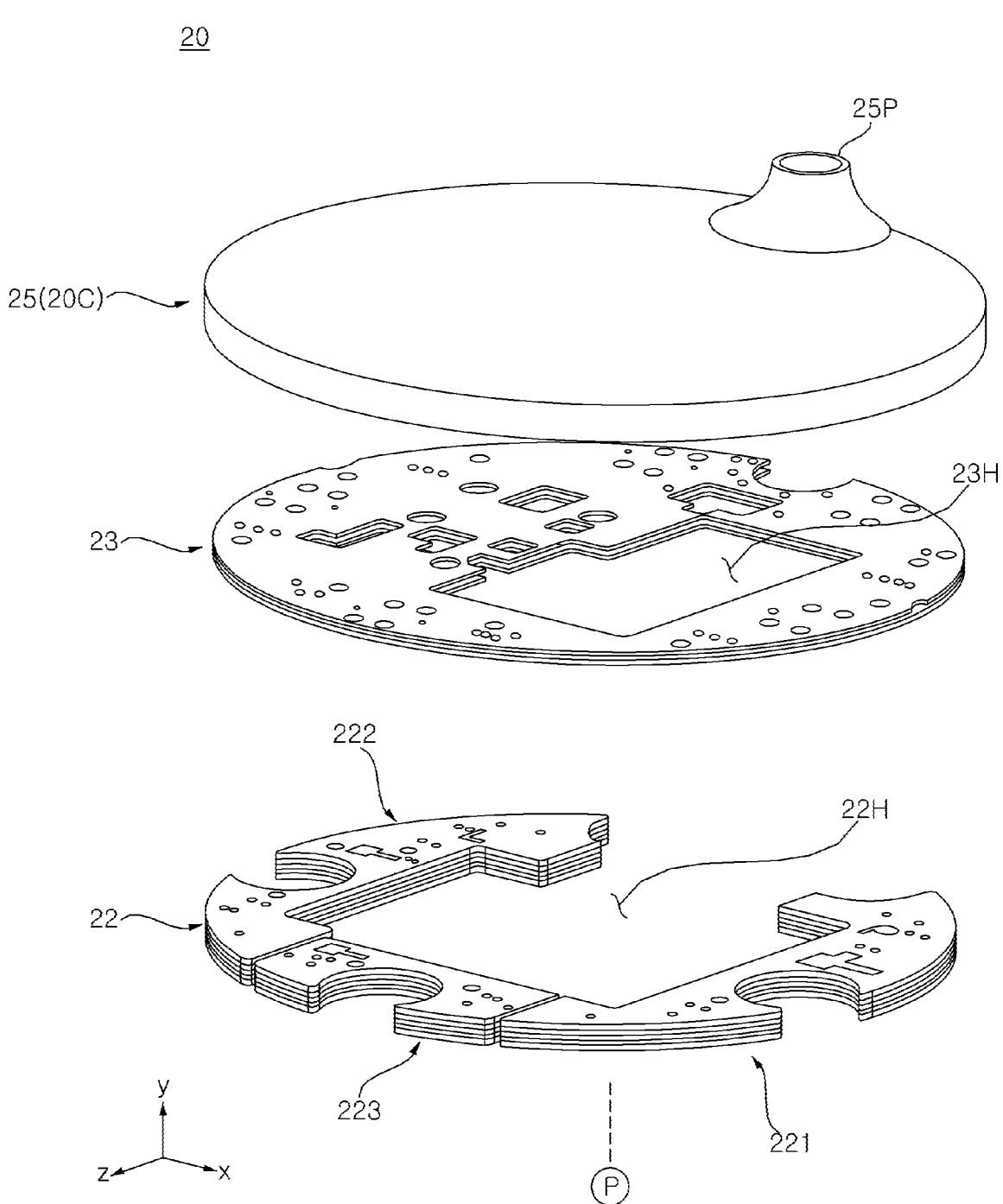

Referring to FIGS. 8 and 9, the base 20 may include a first weight 21, a second weight 22, a third weight 23, a case 20C, and a wheel assembly 26.

The first weight 21 may have a substantially circular plate shape with a plurality grooves or holes formed therein. The first weight 21 may include a metal material. The first weight 21 may be a steel plate. The first weight 21 may be hot rolled galvanized iron (HGI). The first weight 21 may be referred to as a lower weight 21, a bottom weight 21, a first weight plate 21, a first plate 21, a first layer 21, a first sheet 21, or a first member 21.

The second weight 22 may be placed on the first weight 21. The second weight 22 may have a substantially open ring shape with a plurality of grooves formed therein. The second weight 22 may include a metal material. The second weight 22 may be a steel plate. The second weight 22 may be hot rolled galvanized iron (HGI). The second weight 22 may be referred to as a middle weight 22, a central weight 22, a second weight plate 22, a second plate 22, a second layer 22, a second sheet 22, or a second member 22.

The third weight 23 may be placed on the second weight 22. The third weight 23 may have a substantially circular plate shape with a plurality of grooves or holes formed therein. The third weight 23 may include a metal material. The third weight 23 may be a steel plate. The third weight 23 may be hot rolled galvanized iron (HGI). The third weight 23 may be referred to as an upper weight 23, a top weight 23, a third weight plate 23, a third plate 23, a third layer 23, a third sheet 23, or a third member 23.

The first to third weights 21, 22, and 23 may have the same thickness or different thicknesses. For example, the first to third weights 21, 22, and 23 may have the same material and thickness, in which case the first to third weights 21, 22, and 23 may be manufactured with one type of base member.

The case 20C may form the exterior of the base 20, and may cover the first to third weights 21, 22, and 23. The case 20C may have a substantially flat circular box shape. The case 20C may be referred to as a body 20C, a housing 20C, or an outer cover 20C. The case 20C may include a bottom case 24 and a top case 25.

The bottom case 24 may have a round tray shape with an open top. The bottom case 24 may form the bottom of the case 20C. The first to third weights 21, 22, and 23 may be stacked on the bottom case 24. The bottom case 24 may be referred to as a lower case 24 or a first case 24.

The top case 25 may have a round tray shape with an open bottom. The top case 25 may form the top of the case 20C. The top case 25 may cover the first to third weights 21, 22, and 23 stacked on the bottom case 24. The top case 25 may be referred to as an upper case 25 or the second case 25.

The wheel assembly 25 may be disposed under the case 20C, and may be mounted to the case 20C. The wheel assembly 26 may allow the bottom case 24 to be spaced above the ground. That is, the base 20 may be moved via the wheel assembly 26 placed on the ground. The wheel assembly 26 may be referred to as a caster 26 or a moving caster 26.

Figure 10:
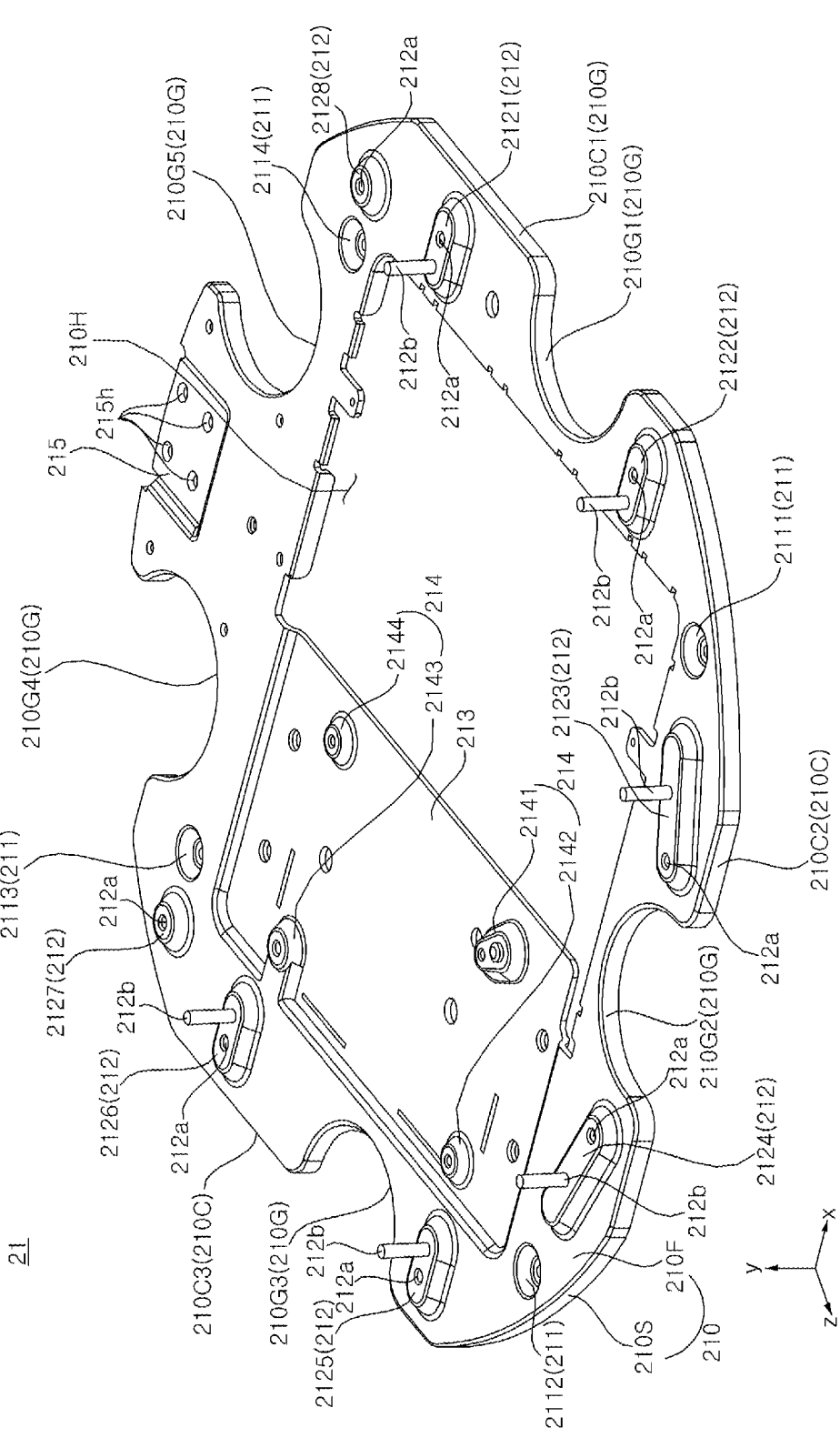
Figure 11:
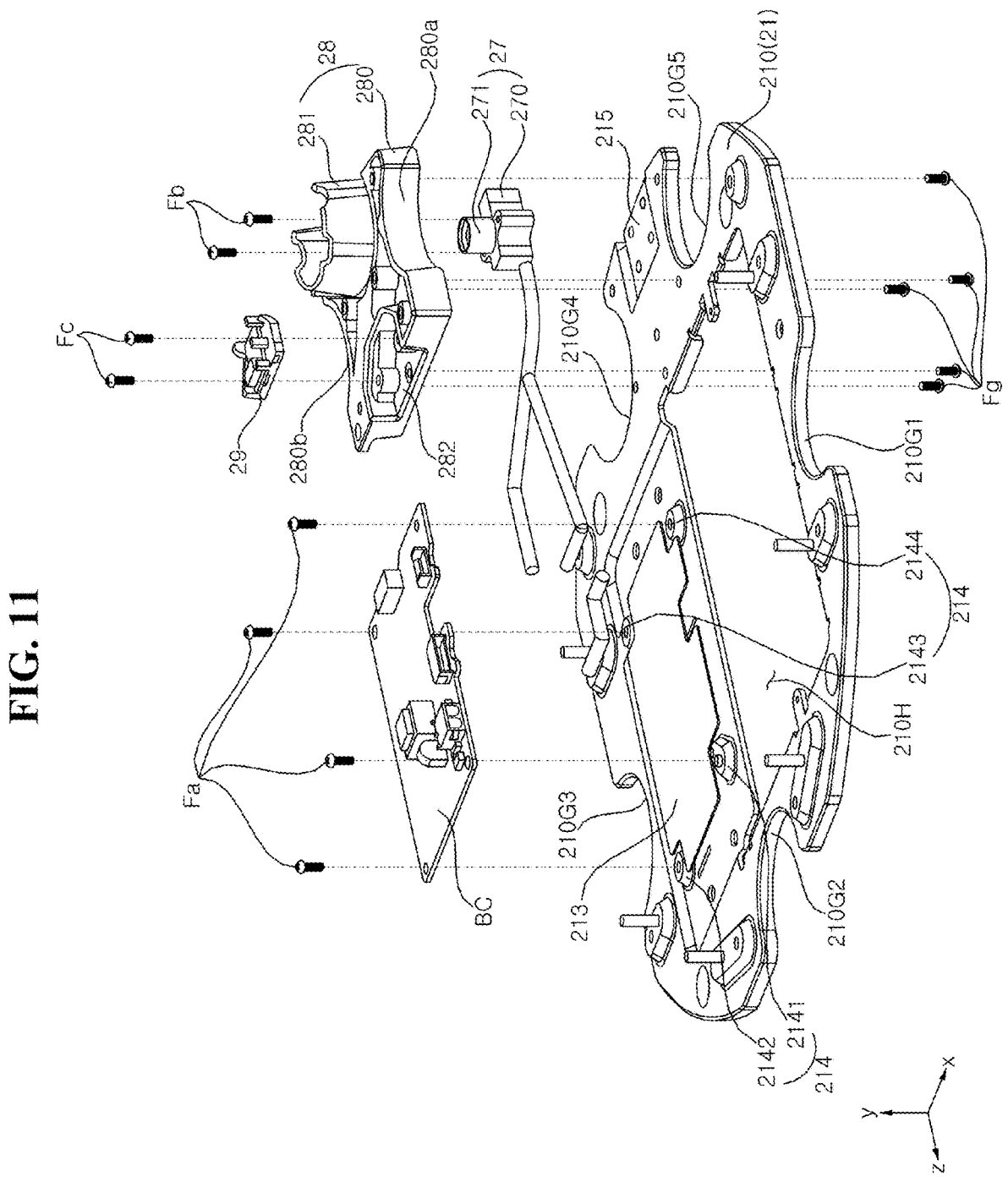

Referring to FIGS. 10 and 11, the first weight 21 may include a body 210, a fixing portion 211, a coupling portion 212, and a recessed portion 213.

The body 210 may have a ring shape. The body 210 may include a flat portion 210F, and a side portion 210S bent downward from an edge of the flat portion 210F to form an edge of the body 210. Grooves 210G may be formed in the edge of the body 210. A first groove 210G1, a second groove 210G2, a third groove 210G3, a fourth groove 210G4, and a fifth groove 210G5 may be formed from an outer surface of the body 210 to the inside of the body 210, and may be spaced apart from each other in a circumferential direction of the body 210. The grooves 210G may be arc-shaped grooves. For example, the grooves 210G may be grooves in the form of an arc (i.e., major arc) greater than a semicircle or semicircular grooves.

Cut-outs 210C may be formed by cutting out a portion of the body 210. A first cut-out 210C1 may be formed by cutting out a first portion of the body 210, and the first groove 210G1 may be formed from the first cut-out 210C1 to the inside of the body 210. A second cut-out 210C2 may be formed by cutting out a second portion of the body 210, and the second groove 210G2 may be formed from the second cut-out 210C2 to the inside of the body 210. A third cut-out 210C3 may be formed by cutting out a third portion of the body 210, and the third groove 210G3 may be formed from the third cut-out 210C3 to the inside of the body 210.

The fixing portion 211 may be formed on a lower surface of the body 210. The fixing portion 211 may be formed by being pressed downward from an upper surface of the body 210, and may protrude from a lower surface of the body 210. Fixing portions 211 may be spaced apart from each other in a circumferential direction of the body 210. A first fixing portion 21111 may be disposed between the first groove 210G1 and the second groove 210G2. A second fixing portion 2112 may be disposed between the second groove 210G2 and the third groove 210G3. A third fixing portion 2113 may be disposed between the third groove 210G3 and the fourth groove 210G4. A fourth fixing portion 2114 may be disposed between the fifth groove 210G5 and the first groove 210G1. The first to fourth fixing portions 210G1, 210G2, 210G3, and 210G4 may be placed at the vertices of a square.

The coupling portion 212 may be formed on the upper surface of the body 210. The coupling portion 212 may be formed by being pressed upward from the lower surface of the body 210, and may protrude from the upper surface of the body 210. Coupling portions 212 may be spaced apart from each other in the circumferential direction of the body 210. The first groove 210G1 may be disposed between a first coupling portion 2121 and a second coupling portion 2122. The second groove 210G2 may be disposed between a third coupling portion 2123 and a fourth coupling portion 2124.

The third groove 210G3 may be disposed between a fifth coupling portion 2125 and a sixth coupling portion 2126. The fourth groove 210G4 and the fifth groove 210G5 may be disposed between a seventh coupling portion 2127 and an eighth coupling portion 2128.

The recessed portion 213 may be disposed at a portion of the hole 210H formed at the center of the body 210 having a ring shape. The recessed portion 213 may have a rectangular plate shape, and the hole 210H of the body 210 which is located next to the recessed portion 213 may be a rectangular hole. The recessed portion 213 may be formed by being pressed downward from the upper surface of the body 210. A protruding portion 214 may protrude from an upper surface of the recessed portion 213. The protruding portion 214 may be formed by being pressed upward from the lower surface of the recessed portion 213. Protruding portions 214 may be spaced apart from each other. For example, first to fourth protruding portions 2141, 2142, 2143, and 2144 may be placed at the vertices of a square.

The first weight 21 may be composed of one sheet or two or more sheets. A plurality of first weights 21 may have the same thickness and shape. The number of first weights 21 may be variable. If a relatively small number of first weights 21 are formed to a specific total thickness, manageability is facilitated. If a relatively large number of first weights 21 are formed to the specific total thickness, the specific total thickness may be easily adjusted within a relatively small range by adjusting the number of first weights 21. Further, if a relatively large number of first weights 21 are formed to the specific total thickness, vibration absorption is facilitated.

The substrate BC may be mounted on the protruding portions 214. Fastening members Fa, such as screws, may pass through the substrate BC to be fastened to holes of the protruding portions 214. At least some of the protruding portions 214 may include guide protrusions (not numbered) inserted into the substrate BC. The substrate BC may be a Printed Circuit Board (PCB) and may be referred to as a battery charger (BC).

A bottom connector 27 may be seated on a seating portion of the first weight 21. The seating portion 215 may be formed by being recessed from an upper surface of the body 210. The bottom connector 27 may include a body 270, a cup 271, and a core 272. The bottom connector 27 may be referred to as a lower connector 27 or a first connector 27.

A block 28 may be opposite to the seating portion 215 of the first weight 21 with respect to the bottom connector 27. For example, the block 28 may be formed by die casting including a material such as aluminum (Al). The block 28 may include a body 280, a wall 281, and a mount 282. The body 280 may cover the body 270 of the bottom connector 27, and the cup 271 of the bottom connector 27 may pass through the body 280. A fastening member Fb, such as a screw, may pass through the body 280 to be fastened to the body 270, thereby allowing the bottom connector 27 to be coupled to the block 28. A first groove 280a may be formed on the left side of the body 280 and may have a curvature corresponding to the fifth groove 210G5. A second groove 280b may be formed on the right side of the body 280 and may have a curvature corresponding to the fourth groove 210G4. The wall 281 may protrude upward from an upper surface of the body 280, and may extend along the arc. The wall 280 may surround at least a portion of a side surface of the cup 271 passing through the body 280. The mount 282 may be a recessed portion formed in an upper surface of the body 280.

An indicator 29 may be disposed on the mount 282 of the block 28. A fastening member Fc, such as a screw, may pass through the indicator 29 to be fastened to the mount 282, thereby allowing the indicator 29 to be coupled to the block 28.

Figure 12:
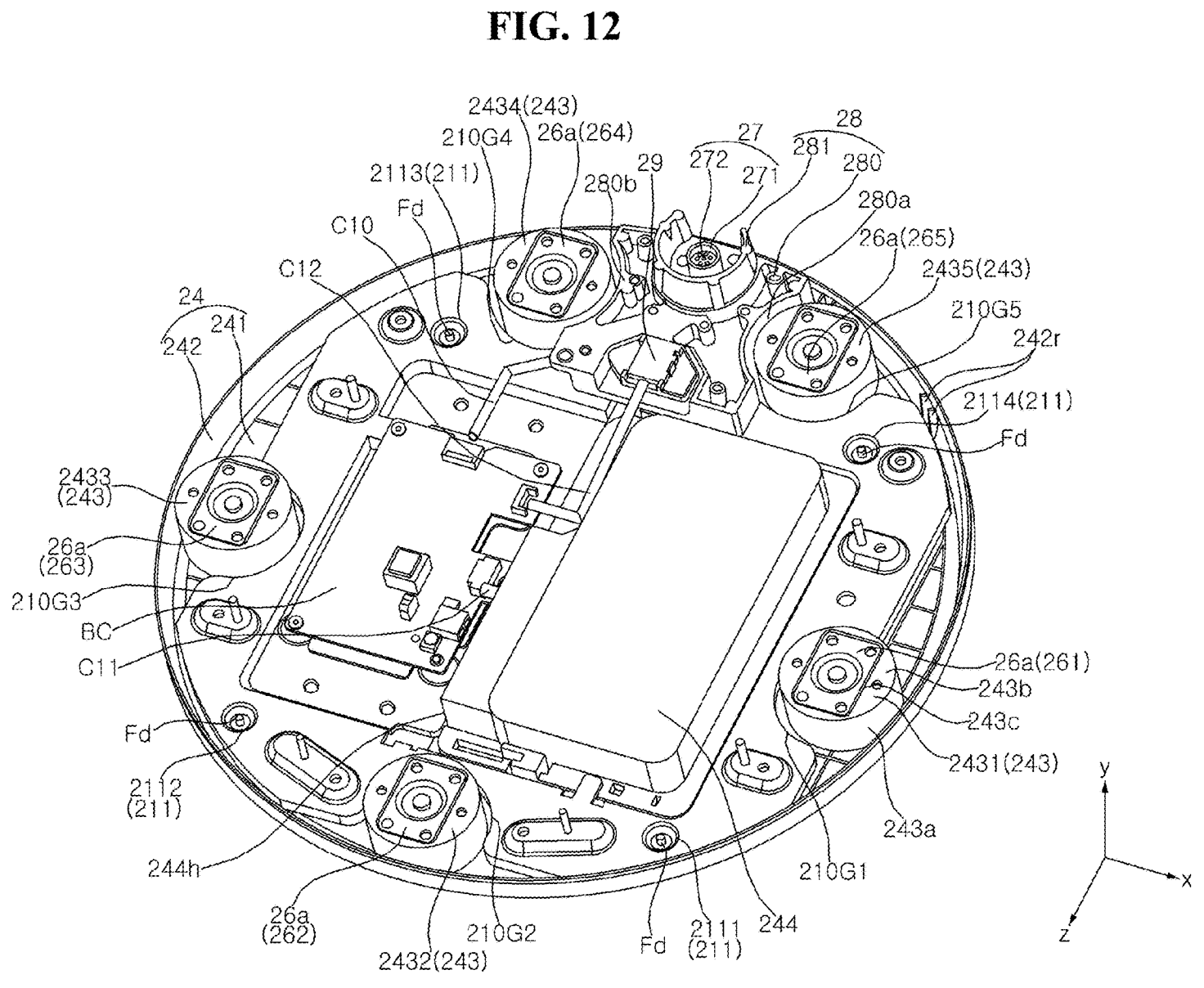
Figure 13:
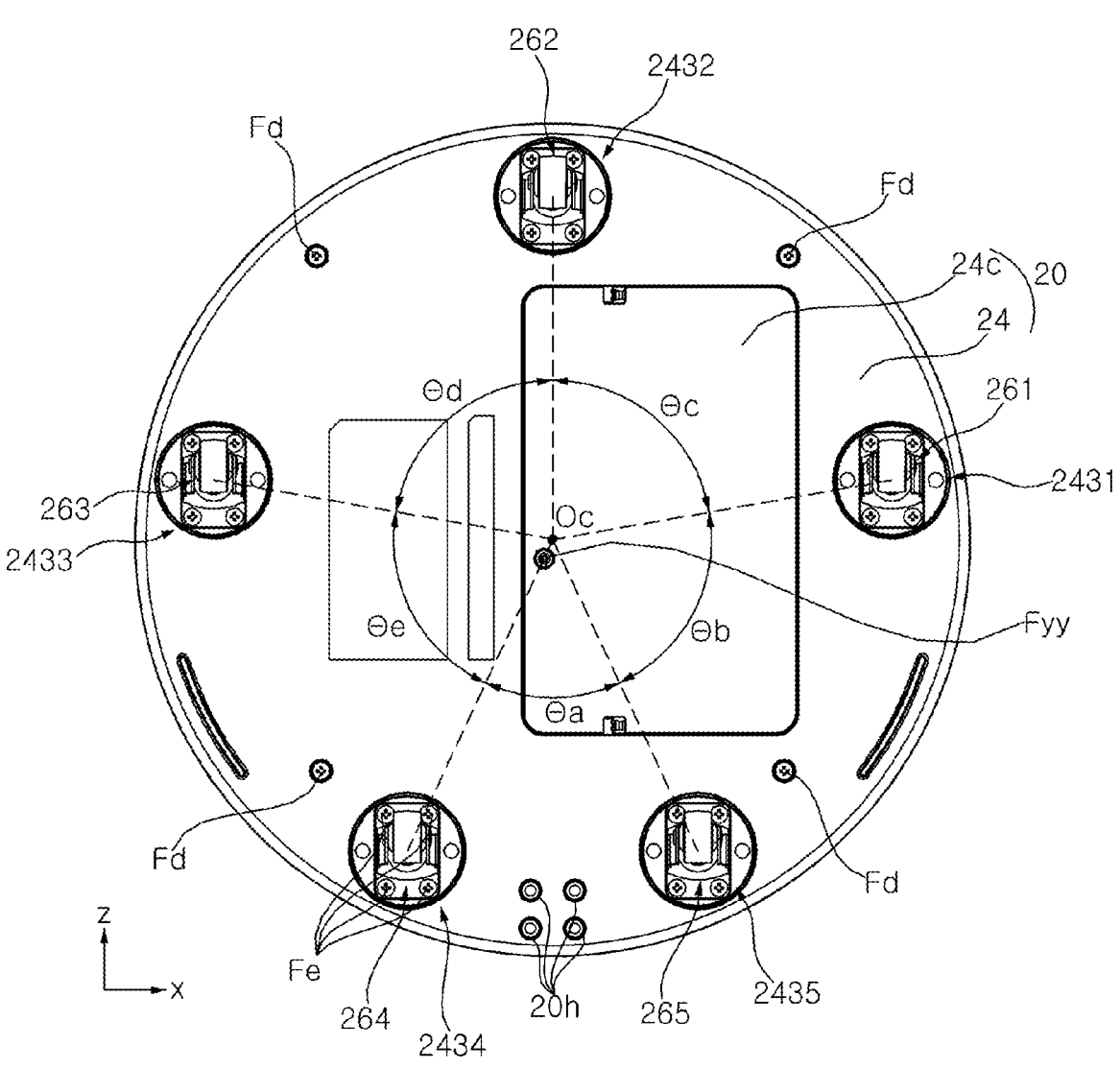

Referring to FIGS. 12 and 13, a bottom case 24 may include a bottom portion 241, a side portion 242, a recessed portion 243, and a storage portion 244. The bottom portion 241 may have a circular plate shape. The side portion 242 may be bent upward from a rim of the bottom portion 241 and may extend in a circumferential direction of the bottom portion 241. The recessed portion 243 may include a first part 143a having a hollow cylinder shape protruding upward from an upper surface of the bottom portion 241, a second part 243b formed at an upper end of the first part 243a, and a hole 243c formed in the second part 243b. The recessed portion 243 may be formed by being pressed upward from a lower surface of the bottom portion 241. A plurality of recessed portions 243 may be adjacent to the side portion 242 and may be spaced apart from each other along the side portion 242. The storage portion 244 may be formed by being pressed upward from the lower surface of the bottom portion 241, and may include an opening 244h facing the substrate BC.

The first weight 21 may be positioned on the bottom portion 241 of the bottom case 24. The first groove 210G1 may surround a portion of a side surface of a first recessed portion 2431. The second groove 210G2 may surround a portion of a side surface of a second recessed portion 2432. The third groove 210G3 may surround a portion of a side surface of a third recessed portion 2433. The fourth groove 210G4 may surround a portion of a side surface of a fourth recessed portion 2434. The fifth groove 210G5 may surround a portion of a side surface of a fifth recessed portion 2435. The storage portion 244 may be disposed in the hole 210H of the first weight 21.

A plurality of ribs 242r may be formed on an inner surface of the side portion 242 of the bottom case 24, and may be spaced apart from each other along the side portion 242. The plurality of ribs 242r may be adjacent to or in contact with the side surface of the first weight 21.

Fastening members Fd, such as screws, may pass through the bottom portion 241 of the bottom case 24 to be fastened to the fixing portions 211 of the first weight 21, thereby allowing the first weight 21 to be coupled to the bottom case 24.

The battery Bt (see FIG. 8) may be inserted into the storage portion 244 from the bottom of the bottom case 24, and may be mounted on the first weight 21 through a fastening member Fy (see FIG. 17) such as a screw. A battery cover 24c my be coupled to the bottom portion 241 of the bottom case 24 by a fastening member Fyy such as a screw, and may cover a lower surface of the battery Bt. The battery cover 24c may form a lower surface of the base 20.

Figure 14:
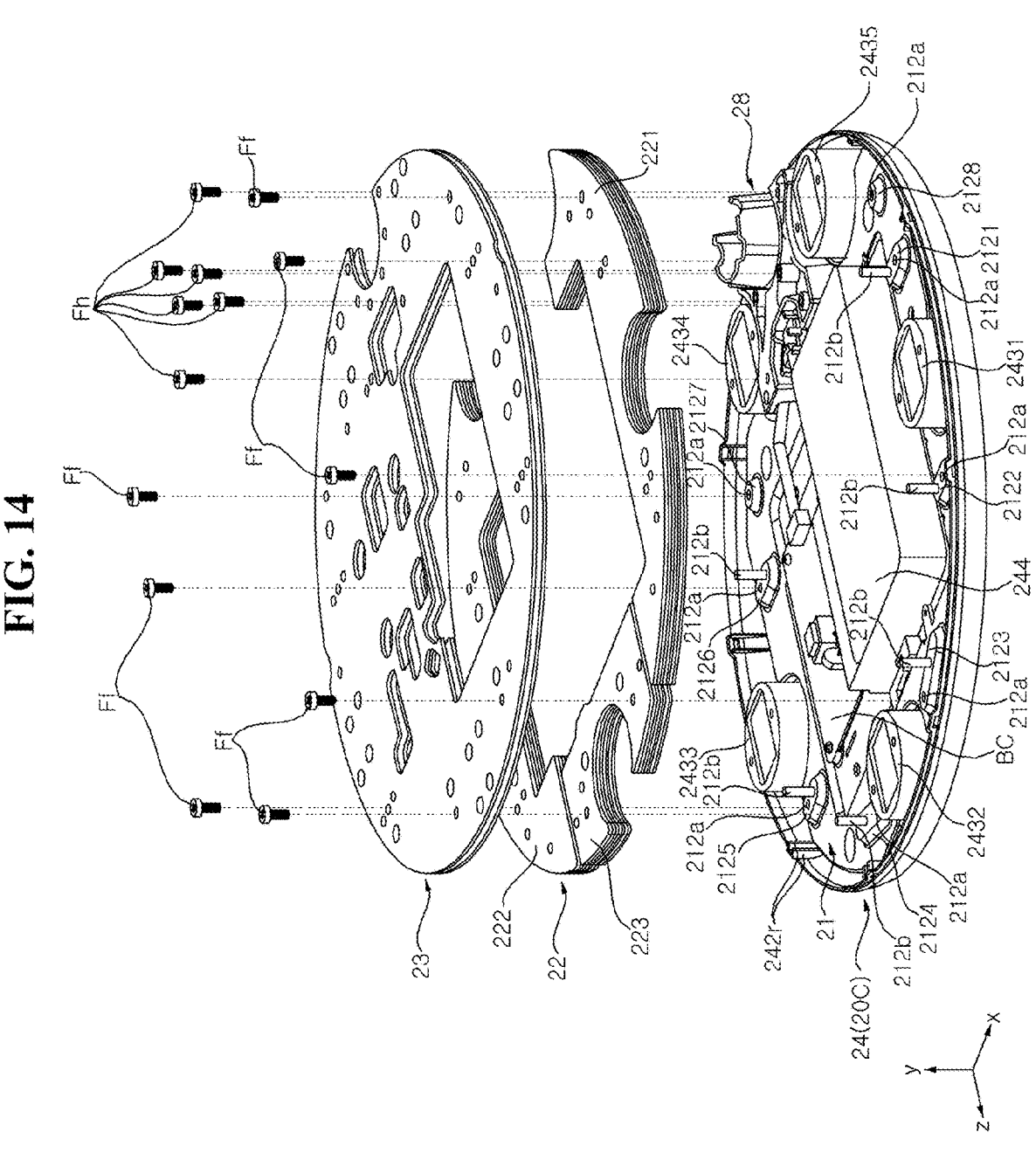

Referring to FIG. 14, the second weight 22 may be positioned on the first weight 21 positioned on the bottom case 24, and the third weight 23 may be positioned on the first weight 21.

Figure 15:
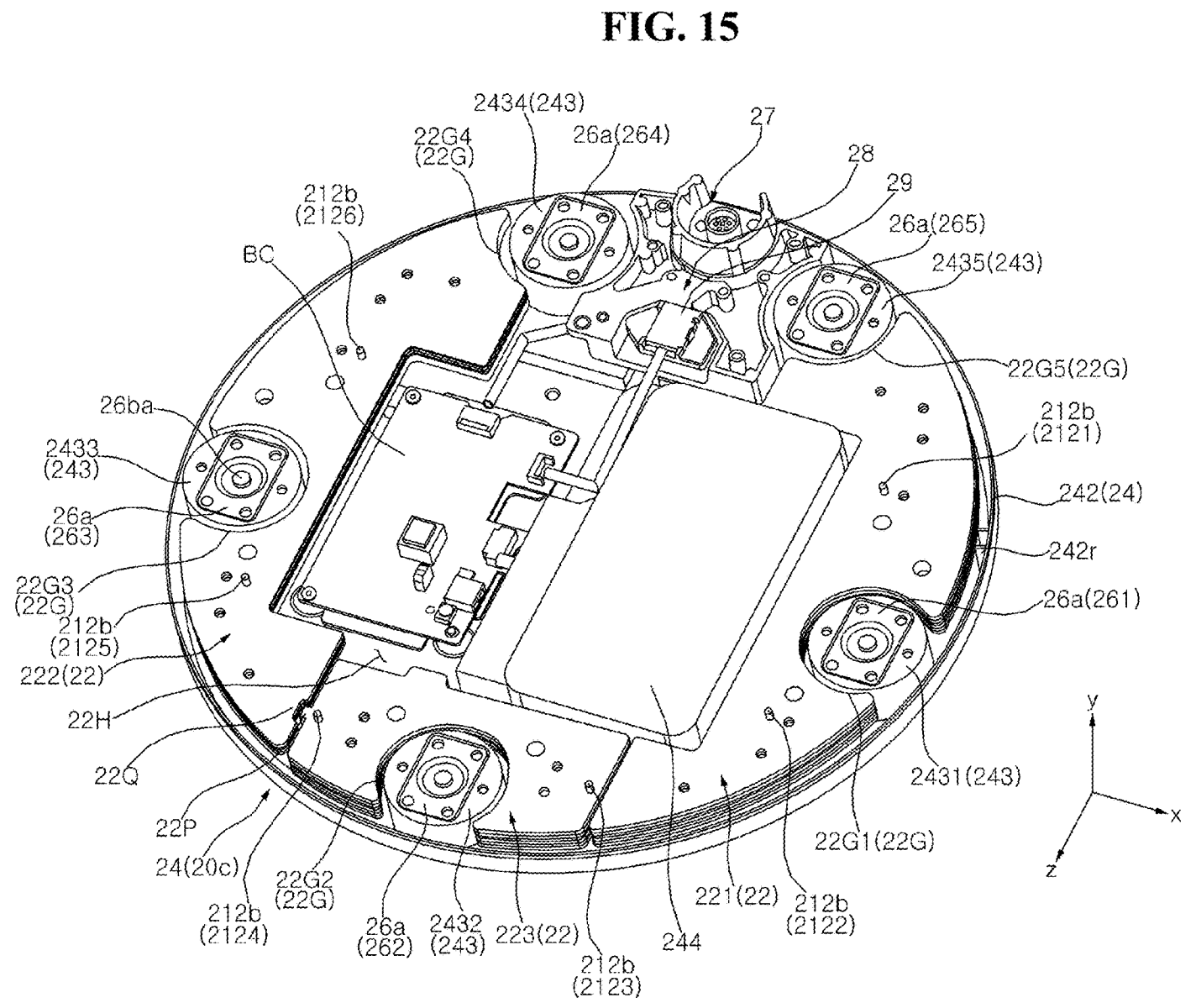

Referring to FIG. 15, the second weight 22 may extend along the side portion 242 of the bottom case 24. For example, the second weight 22 may have an open ring shape. The block 28 may be disposed between both ends of the second weight 22 that are spaced apart from each other. The second weight 22 may not cover the substrate BC, mounted on the first weight 21, and the storage portion 244 of the battery Bt that passes through the first weight 21. That is, the substrate BC and the storage portion 244 may be aligned with or disposed in a hole 22H of the second weight 22. The plurality of ribs 242r may be adjacent to or in contact with the side surface of the second weight 22.

Grooves 22G may be formed in the edge of the second weight 22. The grooves 22G may be arc-shaped grooves. A first groove 22G1 may be formed from an outer surface of the second weight 22 to the inside of the second weight 22, and may surround a portion of the side surface of the first recessed portion 2431. A second groove 22G2 may be formed from an outer surface of the second weight 22 to the inside of the second weight 22, and may surround a portion of the side surface of the second recessed portion 2432. A third groove 22G3 may be formed from an outer surface of the second weight 22 to the inside of the second weight 22, and may surround a portion of the side surface of the third recessed portion 2433. A fourth groove 22G4 may be formed from an outer surface of the second weight 22 to the inside of the second weight 22, and may surround a portion of the side surface of the fourth recessed portion 2434. A fifth groove 22G5 may be formed from an outer surface of the second weight 22 to the inside of the second weight 22, and may surround a portion of the side surface of the fifth recessed portion 2435.

The second weight 22 may include a plurality of parts 221, 222, and 223. Alternatively, the second weight 22 may be formed as one body without being divided into several parts. For example, a first part 221 may be disposed on the left side of the storage portion 244, and the first groove 22G1 and the fifth groove 22G5 may be formed in the first part 221. For example, the second part 222 may be disposed on the right side of the substrate BC, and the third groove 22G3 and the fourth groove 22G4 may be formed in the second part 222. For example, the third part 223 may be disposed between the first part 221 and the second part 222, and may be opposite to the block 28. The plurality of parts 221, 222, and 223 may include a protrusion 22P or a groove 22Q engaged with each other.

The second weight 22 may be composed of one sheet or two or more sheets. The plurality of second weights 22 may have the same thickness and shape. The number of second weights 22 may be variable. If a relatively small number of second weights 22 are formed to a specific total thickness, manageability is facilitated. If a relatively large number of second weights 22 are formed to the specific total thickness, the specific total thickness may be easily adjusted within a relatively small range by adjusting the number of second weights 22. Further, if a relatively large number of second weights 22 are formed to the specific total thickness, vibration absorption is facilitated.

Figure 16:
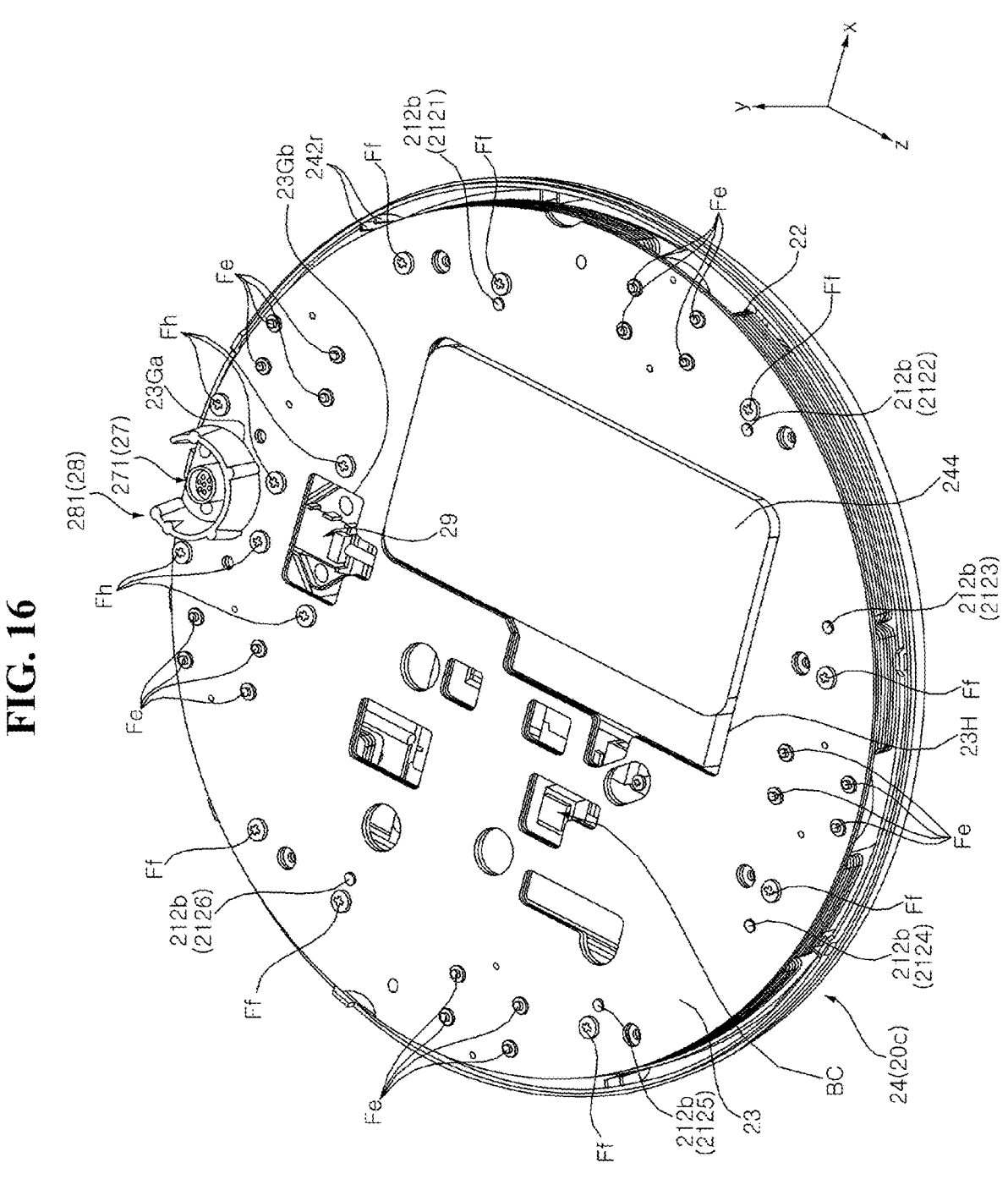

Referring to FIG. 16, the third weight 23 may have a circular plate shape having a diameter smaller than a diameter of the side portion 242 of the bottom case 24. The third weight 23 may cover the second weight 22 (see FIG. 15) and the substrate BC (see FIG. 15), and the storage portion 244 of the battery Bt may be disposed in a hole 23H of the third weight 23. Accordingly, the third weight 23 may protect the substrate BC. In addition, the third weight 23 may cover a plurality of recessed portions 243 (see FIG. 15). The third weight 23 may be positioned on or adjacent to the recessed portions 243 (see FIG. 15).

The third weight 23 may be composed of one sheet or two or more sheets. A plurality of third weights 23 may have the same thickness and shape. The number of third weights 23 may be variable. If a relatively small number of third weights 23 are formed to a specific total thickness, manageability is facilitated. If a relatively large number of third weights 23 are formed to the specific total thickness, the specific total thickness may be easily adjusted within a relatively small range by adjusting the number of third weights 23. Further, if a relatively large number of third weights 23 are formed to the specific total thickness, vibration absorption is facilitated.

Referring back to FIG. 10, a coupling portion 212 of the first weight 212 may include a first hole 212a and a guide pin 212b. The first hole 212a may be formed through the coupling portion 212. A screw thread may be formed on an inner surface of the first hole 212a. The guide pin 212b may protrude upward from the coupling portion 212 and may have a pin shape.

Each of the plurality of coupling portions 212 may have the first hole 212a. At least some of the plurality of coupling portions 212 may include the guide pin 212b. Each of the first to sixth coupling portions 2121, 2122, 2123, 2124, 2125, and 2126 may include the first hole 212a and the guide pin 212b. Each of the seventh and eighth coupling portions 2127 and 2128 may include the first hole 212a.

Figure 17:
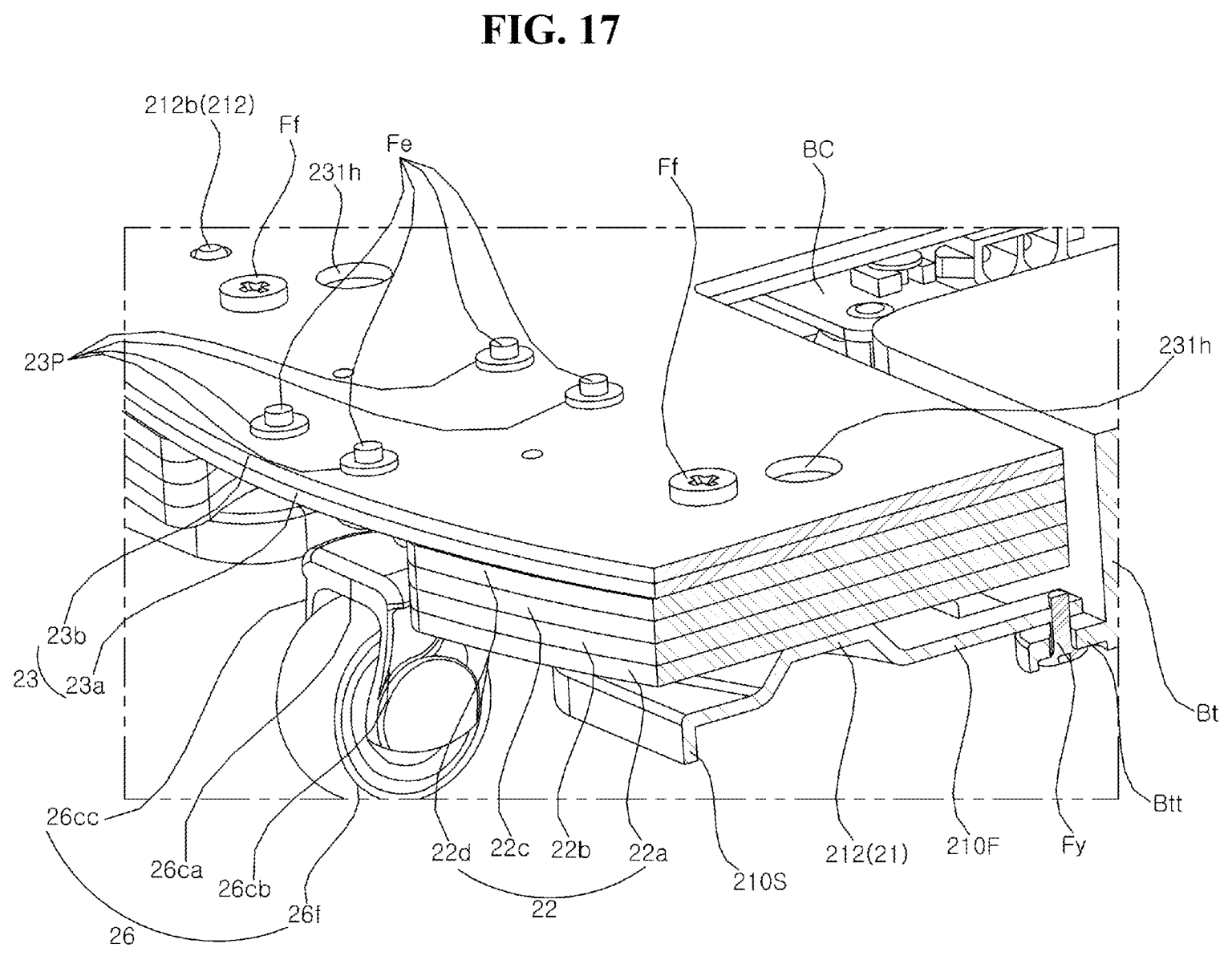
Figure 18:
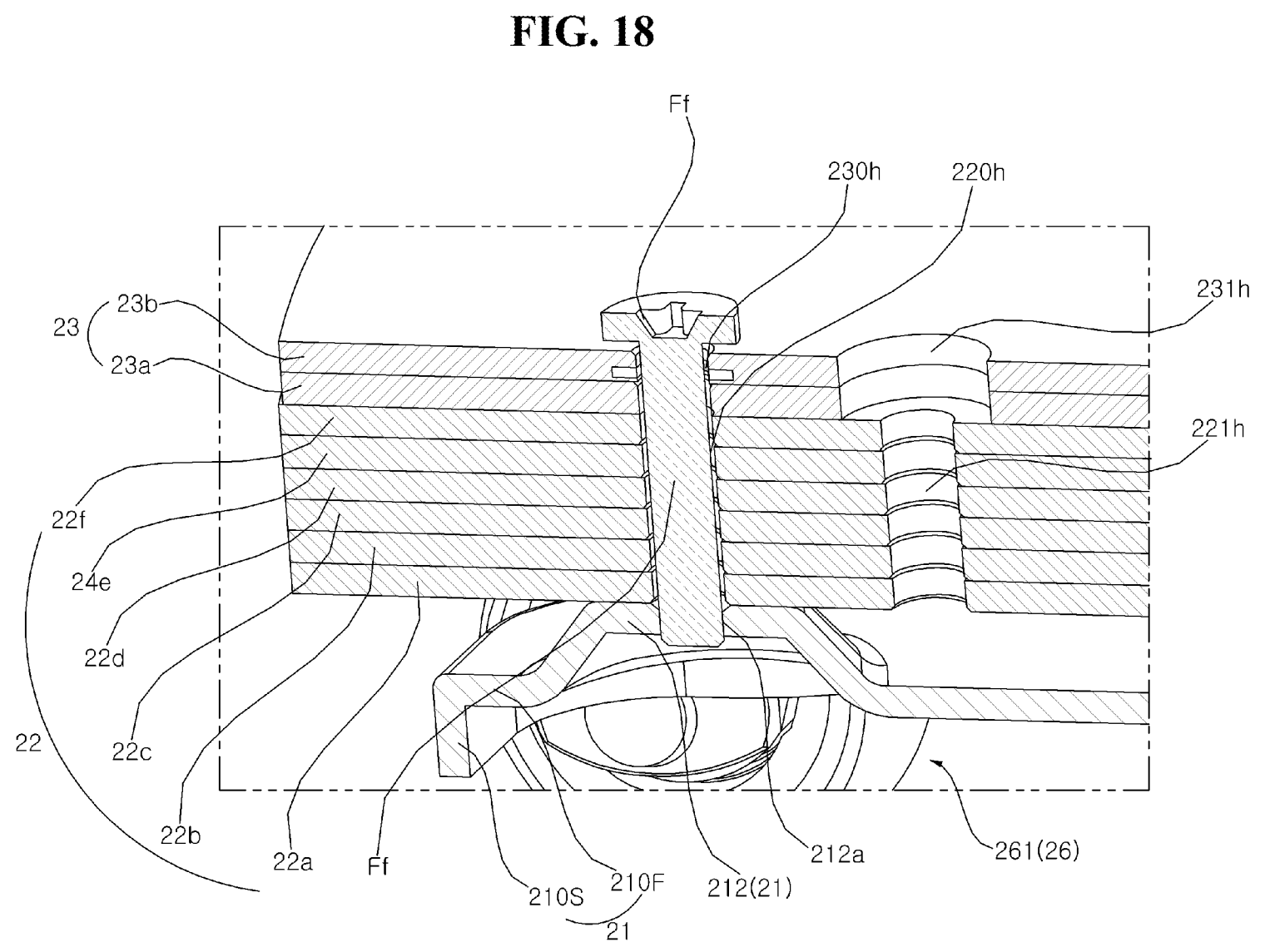

Referring to FIGS. 17 and 18, the second weights 22 and the third weights 23 may be stacked on the coupling portion 212 of the first weight 21. For example, the third weights 23a and 23b may be composed of two sheets. For example, the second weights 22a, 22b, 22c, and 22d may be composed of four sheets (see FIG. 17). In another example, the second weights 22a, 22b, 22c, and 22d may be composed of six sheets (see FIG. 18).

A second hole 220h may be formed through the second weights 22 and may be aligned with the first hole 212a of the coupling portion 212 of the first weight 21. Each of the plurality of second holes 220h may be aligned with the first hole 212a of each of the plurality of coupling portions 2121, 2122, 2123, 2124, 2125, 2126, 2127, and 2128.

A third hole 230h may be formed through the third weights 23 and may be aligned with the second hole 220h of the second weight 22. Each of the plurality of third holes 230h may be aligned with each of the plurality of second holes 220h.

Fastening members Ff, such as screws, may pass through the third holes 230h and the second holes 220h to be fastened to the first holes 212a, thereby allowing the second weights 22 and the third weights 23 to be coupled to the first weight 21. Accordingly, the stability of the base 20 increases, thereby preventing the base 20 placed on the ground from being easily inverted. Further, driving stability of the moving base 20 may be improved, and vibration thereof may be reduced. In addition, specifications, such as weight and the like, of the base 20 may be variably adjusted by adjusting the number of second weights 22 and/or third weights 23 as needed. For example, the first weight 21, the respective second weights 22, and the respective third weights 23 may all have the thickness of 2 mm. For example, a total weight of the second weights 22 composed of six sheets may be greater than a weight of the first weight 21 and a total weight of the three weights 23 composed of two sheets. For example, the weight of the block 28 may be smaller than the weight of the first weight 21.

The guide pin 212b of the coupling portion 212 may pass through the second weights 22 and the third weights 23 which are positioned on the coupling portion 212. Accordingly, the guide pins 212b may guide coupling of the first to third weights 21, 22, and 23.

Alternatively, at least one of the first weight 21 or the second weight 22 may be omitted. The first weight 21 may be omitted, and the second weights 22 and the third weights 23, which are stacked on top of each other, may be coupled to the bottom case 24. The second weights 22 may be omitted, and the third weight 23 spaced apart from the first weight 21 may be coupled to the first weight 21 and the bottom case 24 by a fastening member such as a screw. The second weights 22 may be omitted, and the third weight 23 contacting the first weight 21 while covering the recessed portions 243 may be coupled to the first weight 21 and the bottom case 24 by a fastening member such as a screw. To this end, a portion of the third weight 23 may protrude toward the first weight 21. The first weight 21 and the second weights 22 may be omitted, and the third weight 23 contacting or spaced apart from the bottom case 24 while covering the recessed portions 243 may be coupled to the bottom case 24 by a fastening member such as a screw.

An upper hole 231h may be formed through the third weights 23, and a lower hole 221h may be formed through the second weights 22. The upper hole 231h and the lower hole 221h may be aligned with each other, and a diameter of the upper hole 231h may be greater than a diameter of the lower hole 221h. A fastening member (not shown), such as a screw, may pass through the upper hole 231h to be fastened to the lower hole 221h, and the head of a screw may be inserted into the upper hole 231h, thereby allowing the second weights 22 to be tied together.

Figure 19:
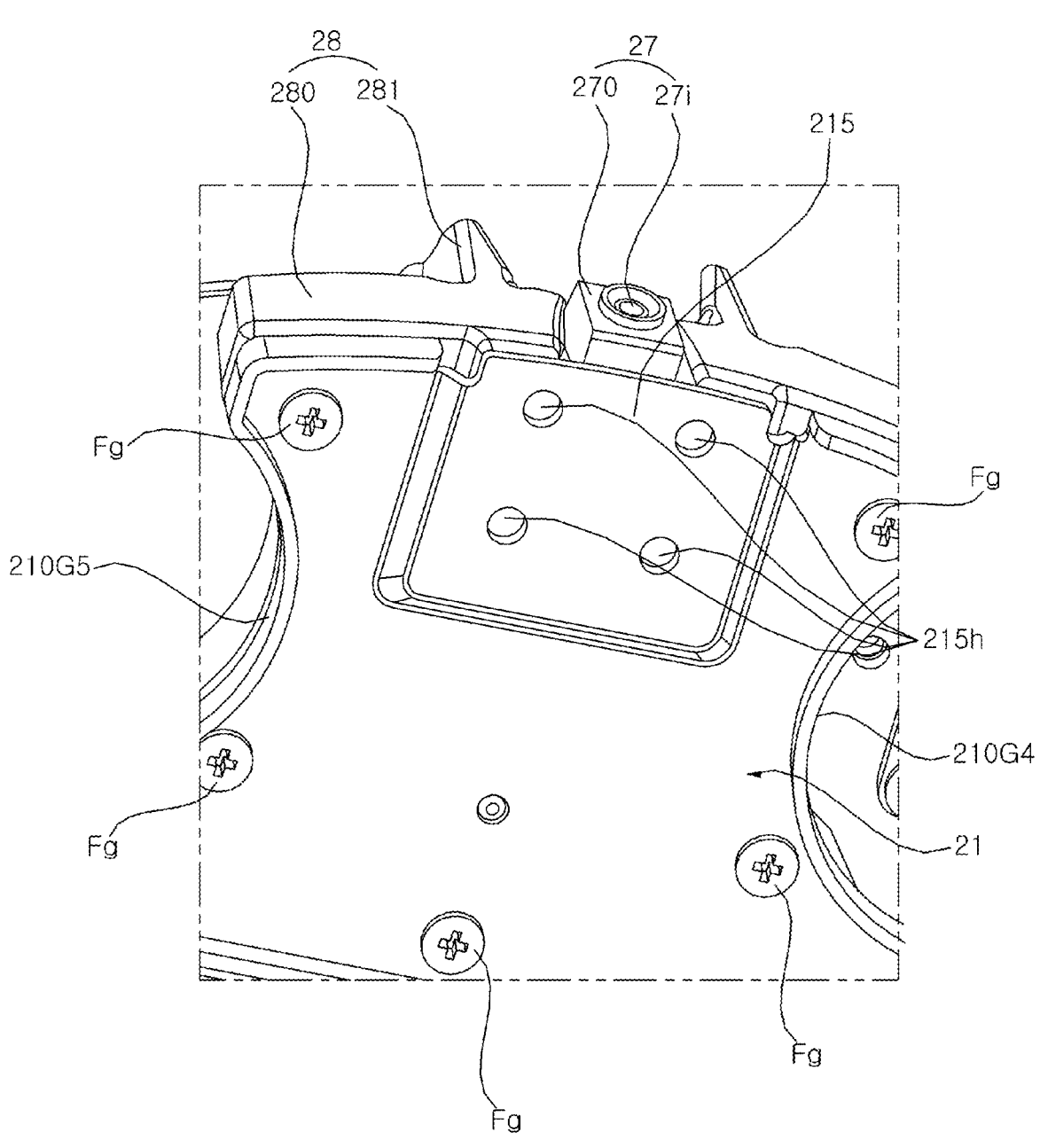

Referring to FIGS. 19 and 16, the body 280 of the block 28 may be seated on the first weight 21, and the body 270 of the bottom connector 27 may be sandwiched between the body 280 and the seating portion 215 of the first weight 21. The third weight 23 may cover the body 280 of the block 28, and may have a groove 23Ga through which the wall 281 of the block 28 passes. The indicator 29 mounted on the body 280 of the block 28 may be exposed upward through a hole 23Gb of the third weight 23.

First fastening members Fg, such as screws, may pass through the first weight 21 to be fastened to the body 280 of the block 28. Second fastening members Fh, such as screws, may pass through the third weight 23 to be fastened to the body 280 of the block 28. Accordingly, the body 280 of the block 28 may be sandwiched between the first weight 21 and the third weight 23, and the bottom connector 27 may be firmly mounted to the weights 21 and 23 through the block 28.

Figure 20:
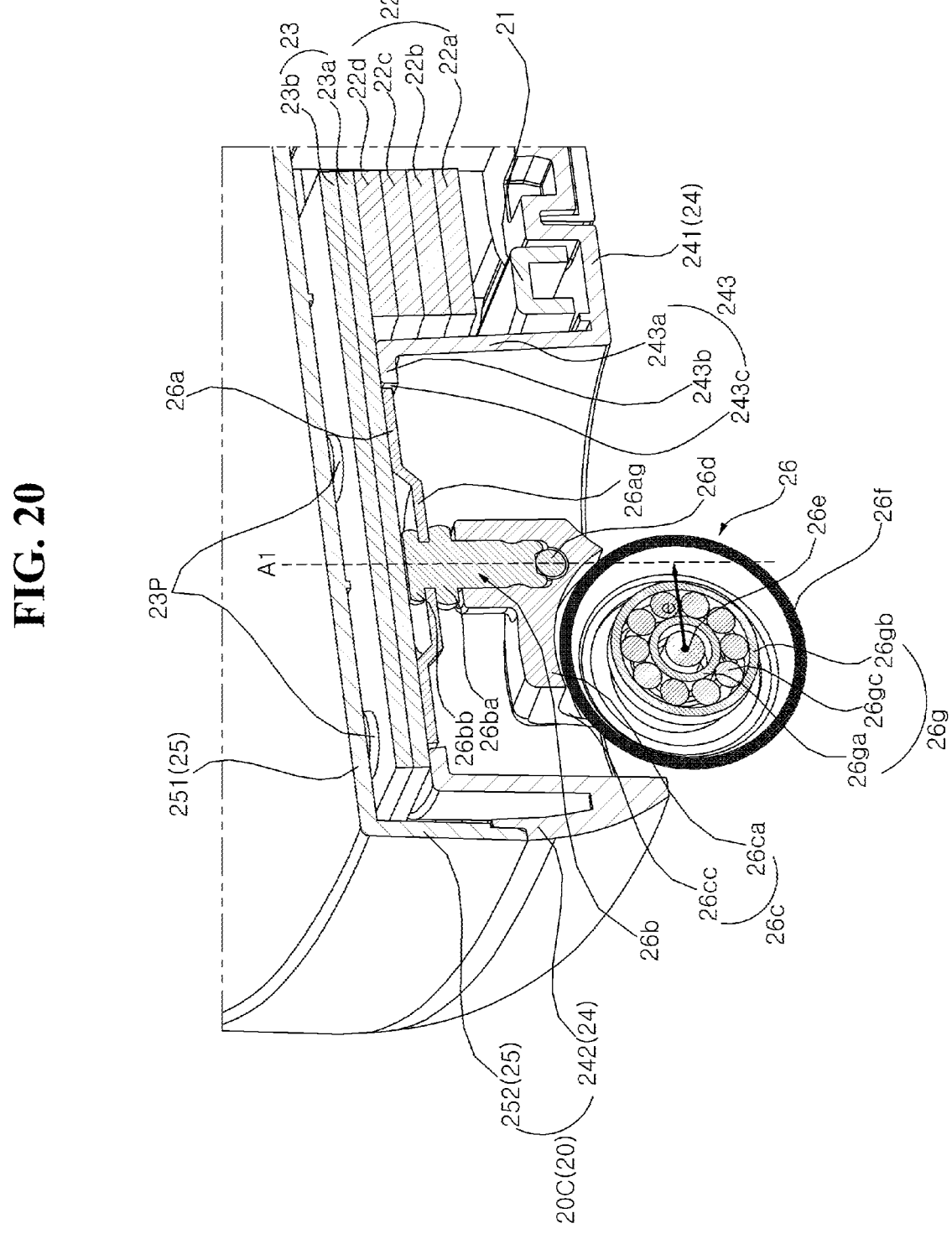

Referring to FIG. 20, a wheel assembly 26 may include a wheel plate 26a, a stem 26b, a body 26c, a ball 26d, a shaft 26e, a wheel 26f, and a bearing 26g.

The wheel plate 26a may have a generally rectangular plate shape (see FIG. 15). The wheel plate 26a may be disposed in the hole 243c of the recessed portion 243. Holes 26ah may be adjacent to the edge of the wheel plate 26a and may be formed through the wheel plate 26a. The third weight 23 may cover the recessed portion 243 and the wheel plate 26a, and holes 232h (see FIGS. 16 and 17) of the third weight 23 may be aligned with the holes 26ah of the wheel plate 26a. For example, the third weight 23 may be composed of two sheets, and the hole 232h may be formed through a third lower weight 23a and a third upper weight 23b. In this case, the third upper weight 23b may include a protruding portion 23P having the hole 232h, and a screw thread may be formed on an inner surface of the hole 232h formed in the protruding portion 23P. The protruding portion 23P may be referred to as a tapping portion 23P. Fastening members Fe, such as screws, may pass through the holes 26ah to be fastened to the hole 232h, thereby allowing the wheel plate 26a to be coupled to the third weight 23.

The stem 26b may be disposed in an internal space of the first part 243a, and may protrude downward from the wheel plate 26a. The stem 26b may be elongated vertically. A first portion 26ba of the stem 26b may be disposed below the wheel plate 26a, and a second portion 26bb of the stem 26b may be fixed in the form of a rivet to a recessed portion 26ag formed in an upper surface of the wheel plate 26a.

The body 26c may be opposite to the wheel plate 26a with respect to the stem 26b. A first portion 26ca of the body 26c may surround a portion of the stem 26b. A second portion 26cb and a third portion 26cc of the body 26c may protrude downward from the first portion 26ca and may be horizontally spaced apart from each other (see FIG. 17).

The ball 26d may be disposed between a groove (not numbered) at a lower end of the stem 26b and a groove (not numbered) formed in an inner surface of the first portion 26ca. The body 26c may swivel around a longitudinal axis A1 of the stem 26b.

The shaft 26e may be elongated horizontally and may be coupled to the second and third portions 26cb and 26cc of the body 26c.

The wheel 26f may be disposed between the second and third portions 26cb and 26cc of the body 26c and may surround an outer circumferential surface of the shaft 26e. The wheel 26f may protrude downward from a lower surface of the bottom case 24 (see distance Dw). The wheel 26f may include rubber, silicon, resin, or ABS material.

The bearing 26g may be disposed between the shaft 26e and the wheel 26f and may be coupled to the shaft 26e and the wheel 26f. The bearing 26g may include an inner ring 26ga, an outer ring 26gb, and rotating members 26gc. The inner ring 26ga may be coupled to an outer circumference of the shaft 26e. The outer ring 26gb may be concentric with the inner ring 26ga and may have a greater diameter than the inner ring 26ga. The rotating members 26gc may be rotatably coupled between the inner ring 26ga and the outer ring 26gb. The rotating members 26gc may be balls or rollers. The bearing 26g may support rotation of the wheel 26f about the shaft 26e.

Accordingly, the wheel 26f may rotate around the shaft 26e. In addition, the wheel 26f may rotate around the stem 26b. That is, the wheel 26f may rotate around two axes. The center of the shaft 26e may be offset a predetermined distance e from the longitudinal axis A1 of the stem 26b. The wheel assembly 26 is coupled to the third weight 23 with ensured flatness, such that driving stability may be improved, and the base 20 may smoothly move on the ground using the wheel assembly 26.

A plurality of wheel assemblies 261, 262, 263, 264, and 265 (see FIG. 13) may be spaced apart from each other along a circumference of the base 20. A portion of a first wheel assembly 261 may be inserted into the first recessed portion 2431 and may be coupled to the third weight 23 (see FIG. 16) by the fastening members Fe. A portion of a second wheel assembly 262 may be inserted into the second recessed portion 2432 and may be coupled to the third weight 23 (see FIG. 16) by the fastening members Fe. A portion of a third wheel assembly 263 may be inserted into the third recessed portion 2433 and may be coupled to the third weight 23 (see FIG. 16) by the fastening members Fe. A portion of a fourth wheel assembly 264 may be inserted into the fourth recessed portion 2434 and may be coupled to the third weight 23 (see FIG. 16) by the fastening members Fe. A portion of a fifth wheel assembly 265 may be inserted into the fifth recessed portion 2435 and may be coupled to the third weight 23 (see FIG. 16) by the fastening members Fe.

In this case, the first wheel assembly 261 and the second wheel assembly 262 may be adjacent to a bottom hole 20h. With respect to a center Oc of the base 20, an angle theta a between the first wheel assembly 261 and the second wheel assembly 262 may be a minimum angle among angles between a plurality of wheel assemblies 291, 292, 293, 294, and 295. With respect to the center Oc of the base 20, an angle theta b between the second wheel assembly 262 and the third wheel assembly 263, an angle theta c between the third wheel assembly 263 and the fourth wheel assembly 264, an angle theta d between the fourth wheel assembly 264 and the fifth wheel assembly 265, and an angle theta e between the fifth wheel assembly 265 and the first wheel assembly 261 each may be greater than the angle theta a. For example, the angles theta b, theta c, theta d, and theta e may be substantially equal to each other.

The top case 25 may cover the third weight 23 and may include a top portion 251 and a side portion 252. The top portion 251 may have a circular plate shape. The side portion 252 may be bent downward from a circumference of the top portion 251 and may extend in a circumferential direction of the top portion 251. The side portion 252 of the top case 25 may be coupled to the side portion 242 of the bottom case 24 by a snap-fit structure or a latch structure, and the like.

Figure 21:
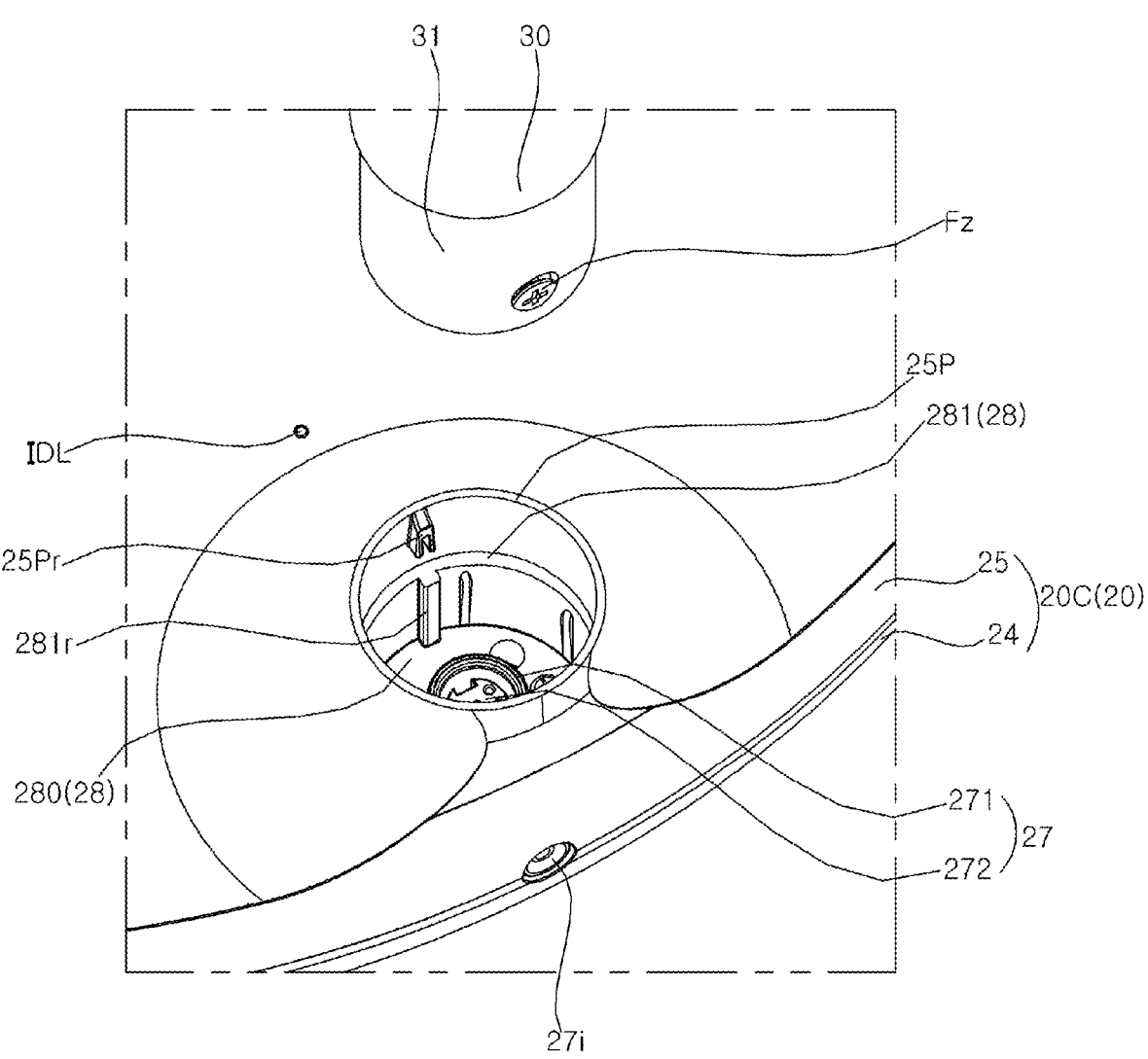
Figure 22:
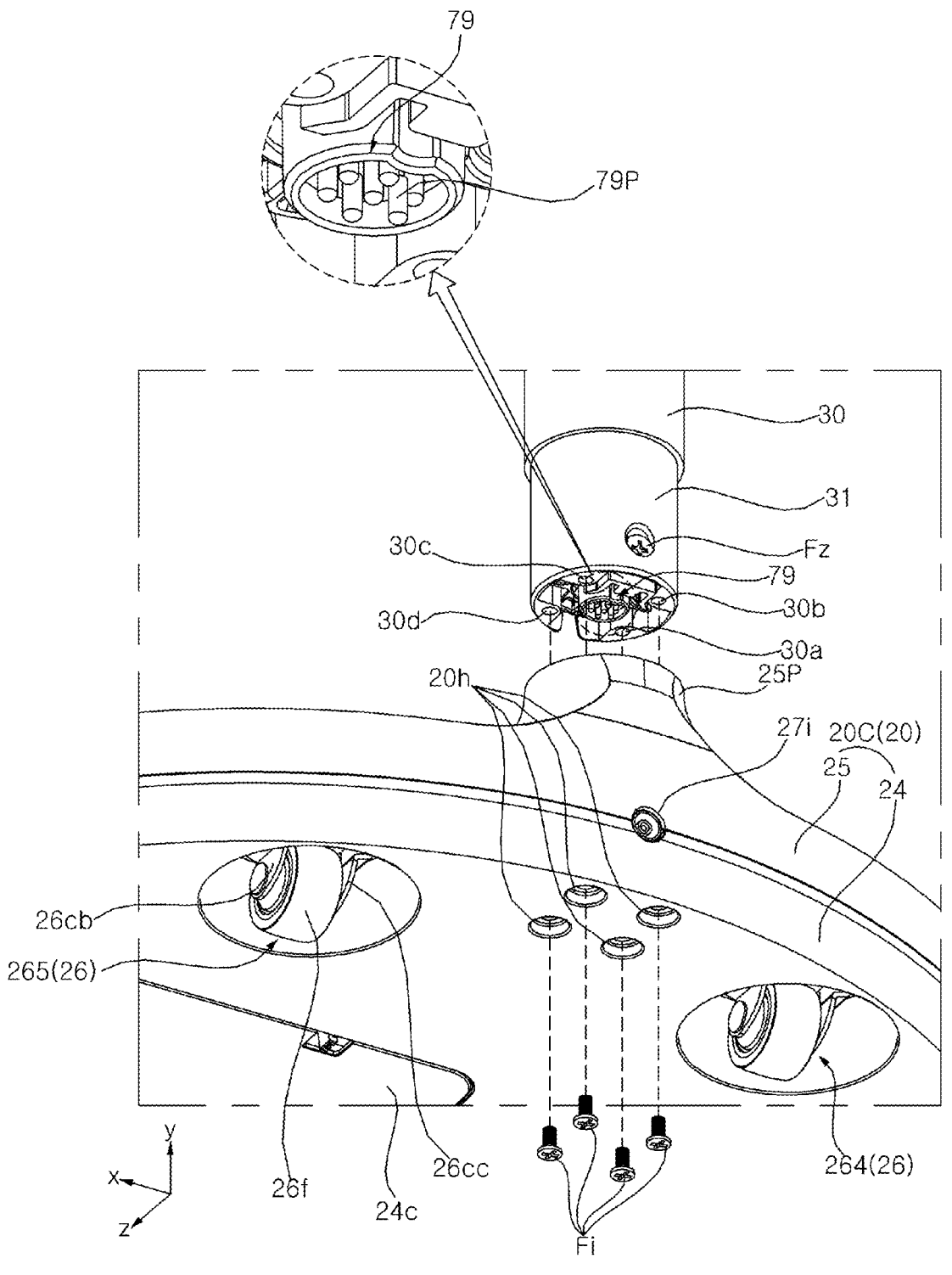

Referring to FIGS. 21 and 22, a port 25P may be formed in an upper surface of the base 20 and may be adjacent to a circumference of the base 20. The portion 25P may be in the shape of a monticule. A guide rib 25 Pr may be formed on an inner surface of the port 25P.

The wall 281 of the block 28 may be aligned with the port 25P. A guide rib 281r may be formed on an inner surface of the wall 281 and may be vertically aligned with the guide rib 25Pr.

An insertion portion 31 may form a lower end of the pole 30. A diameter of the insertion portion 31 may be smaller than another portion of the pole 30. A guide slit 31s may be formed through a side surface of the insertion portion 31. When the insertion portion 31 is inserted into the port 25P and the wall 281, the guide ribs 26r and 281r may be inserted into the guide slit 31s. That is, the guide ribs 26r and 281r may guide coupling of the pole 30 and the base 20.

Fastening members Fi, such as screws, may pass through the bottom holes 20h formed in a lower surface of the base 20, the holes 215h (see FIG. 19) formed in the seating portion 215, and the body 280 (see FIG. 19) of the block 28, to be fastened to protruding portions 30a, 30b, 30c, and 30d of the pole 30, thereby allowing the pole 30 to be coupled to the base 20. The protruding portions 30a, 30b, 30c, and 30d may be formed on an inner surface of the pole 30, and may be spaced apart from each other in a circumferential direction of the top connector 79. The protruding portions 30a, 30b, 30c, and 30d may be referred to as ribs 30a, 30b, 30c, and 30d.

The top connector 79 may be mounted inside the insertion portion 31. The top connector 79 may be referred to as an upper connector 79 or a second connector 79. The top connector 79 may be vertically aligned with the core 272 of the bottom connector 27.

For example, the top connector 79 may include a plurality of pins 79P, and the bottom connector 27 may include a plurality of pin holes 272h into which the plurality of pins 79P are inserted. The pin holes 272h may be formed in the core 272.

In another example, the top connector 79 may include a plurality of pin holes, and the bottom connector 27 may include a plurality of pins inserted into the plurality of pin holes.

Accordingly, when the insertion portion 31 is inserted into the base 20, the top connector 79 and the bottom connector 27 may be electrically connected to each other. A cable C connected to the top connector 79 may be electrically connected to the head 10 through the pole 30 and the motion module MM.

The battery Bt placed in the storage portion 244 may be electrically connected to the substrate BC by a cable C11, and the substrate BC may be electrically connected to the bottom connector 27 by a cable C10. Accordingly, power of the battery Bt may be supplied to the head 10 through the cable C11, the substrate BC, the cable C10, the bottom connector 27, the top connector 79, and the cable C. An external power source may charge the battery Bt through a power cable connected to a jack 27i.

The indicator 29 may be electrically connected to the substrate BC through a cable C12, and may detect a remaining capacity of the battery Bt. A light emitting element IDL (see FIG. 21) of the indicator 29 may be provided on an upper surface of the base 20, and may display a remaining capacity of the battery Bt for a user.

Referring to FIGS. 1 to 22, a display device may include: a display panel; and a stand supporting the display panel, wherein the stand may include: a base; and a pole connecting the base and the display panel, wherein the base may include: a case; a weight positioned in an internal space of the case; a recessed portion recessed toward the internal space of the case from a bottom of the case, the recessed portion covered by the weight and having a hole facing the weight; and a wheel assembly inserted into the recessed portion, and protruding downward from the bottom of the case, wherein the wheel assembly may include a wheel plate positioned at the hole of the recessed portion and coupled to the weight.

The display device may further include a screw fixing the wheel plate to the weight.

The case may include: a bottom case forming the bottom of the case and at which the recessed portion is formed; and a top case covering the weight and coupled to the bottom case, wherein the weight may include: a first weight positioned on the bottom case; a second weight positioned on the first weight; and a third weight positioned on the second weight and covering the recessed portion.

The second weight may include a plurality of second weights which are stacked on top of each other.

The third weight may include: a third lower weight covering the recessed portion; and a third upper weight positioned on the third lower weight, wherein the display device may further include a fastening member passing through the wheel plate and the third lower weight to be fastened to the third upper weight.

The display device may further include a fastening member fixing the second and third weights to the first weight, wherein the first weight may include: a body fixed to the bottom case; and a coupling portion on which the second weight is positioned, the coupling portion protruding from the body toward the second weight and having a first hole to which the fastening member is coupled, wherein: the second weight may include a second hole through which the fastening member passes, the second hole aligned with the first hole; and the third weight may include a third hole through which the fastening member passes, the third hole aligned with the second hole.

The coupling portion may further include a guide pin protruding from the coupling portion and passing through the second and third weights.

The recessed portion may include a plurality of recessed portions which are adjacent to a perimeter of the bottom case and spaced apart from each other along the perimeter, wherein the wheel assembly may include a plurality of wheel assemblies inserted into the plurality of recessed portions, wherein: the first weight may include grooves in which the plurality of recessed portions are positioned, the grooves formed at a side surface of the first weight; the second weight may include grooves in which the plurality of recessed portions are positioned, the grooves formed at a side surface of the second weight; and the third weight may cover the plurality of recessed portions.

The display device may further include a substrate mounted on the first weight, wherein the second weight may further include a hole aligned with the substrate, and the third weight may cover the substrate.

The display device may further include a battery electrically connected to the substrate, wherein the first to third weights may include holes at which the battery is positioned.

The second weight may include a plurality of parts adjacent to each other in a perimeter direction of the bottom case.

The display device may further include: a head having the display panel; a top connector mounted in the pole and electrically connected to the head; and a bottom connector mounted in the base and electrically connected to the top connector, wherein the weight may include a pair of weights opposite to each other with respect to the bottom connector.

The display device may further include a block to which the bottom connector is coupled, wherein the pair of weights may include: a lower weight on which the block is positioned, the lower weight coupled to the block; and an upper weight covering the block and coupled to the block, wherein the block and the bottom connector may be sandwiched between the lower weight and the upper weight.

The display device may further include: a substrate mounted in the base and electrically connected to the bottom connector; and a battery mounted in the base and electrically connected to the substrate.

The stand may further include an arm connecting the pole and the display panel and extending in a direction intersecting the pole.

The display device according to the present disclosure has the following effects.

According to at least one of the embodiments of the present disclosure, a display device including a stand for a display panel may be provided.

According to at least one of the embodiments of the present disclosure, a structure for freely moving a display device may be provided.

According to at least one of the embodiments of the present disclosure, a structure for improving standing stability and moving stability of a display device may be provided.

According to at least one of the embodiments of the present disclosure, a structure for reducing vibration of a moving display device may be provided.

According to at least one of the embodiments of the present disclosure, a structure for electrically connecting a base and a pole of a display device may be provided.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

What is claimed is:

1. A display device comprising:
a display; and
a stand supporting the display,
wherein the stand comprises:
a base; and
a pole connecting the base and the display,
wherein the base comprises:
a case;
a recessed portion recessed toward an internal space of the case from a bottom of the case;
a first plate positioned on a bottom portion of the case which forms the bottom of the case;
a second plate covering the first plate and the recessed portion;
a third plate covering the second plate; and
a wheel assembly inserted into the recessed portion,
wherein the recessed portion is shaped to define a hole facing the second plate,
wherein the wheel assembly comprises:
a wheel plate positioned in the hole of the recessed portion, and
a fastening member which passes through the wheel plate and which is fastened to the second plate.

2. The display device of claim 1, wherein the fastening member is a screw.

3. The display device of claim 1, wherein the case comprises:
a bottom case forming the bottom of the case and at which the recessed portion is formed; and
a top case covering the third plate and coupled to the bottom case.

4. The display device of claim 1, further comprising a middle plate positioned between the first plate and the second plate.

5. The display device of claim 4, further comprising an additional fastening member coupling the first to third plates to the middle plate,
wherein each of the first to third plates is shaped to define a respective first hole into which the additional fastening member is inserted,
wherein the middle plate is shaped to define a second hole which is aligned with the first hole of each of the first to third plates and into which the additional fastening member is inserted.

6. The display device of claim 5, further comprising a guide pin inserted into the second and third plates and the middle plate to guide positions of the second and third plates and the middle plate relative to the first plate.

7. The display device of claim 1, further comprising:
a top connector mounted in the pole and electrically connected to the display; and
a bottom connector mounted in the base and electrically connected to the top connector,
wherein the bottom connector is coupled to the first plate.

8. The display device of claim 7, wherein the bottom connector comprises:

a body coupled to the first plate; and a cup protruding from the body, wherein each of the second and third plates is shaped to define a hole positioned corresponding to the cup.

9. The display device of claim 7, further comprising a substrate mounted in the base and electrically connected to the bottom connector.

10. The display device of claim 1, wherein the stand further comprises an arm extending in a direction intersecting the pole and connecting the pole and the display.

11. A display device comprising:

a display; and a stand supporting the display, wherein the stand comprises:

a base; and a pole connecting the base and the display, wherein the base comprises:

a case;

a plurality of recessed portions recessed toward an internal space of the case from a bottom of the case and spaced apart from each other along an edge of the case, a first plate positioned on a bottom portion of the case which forms the bottom of the case;

a second plate covering the first plate and the plurality of recessed portions;

a third plate covering the second plate; and a plurality of wheel assemblies inserted into the plurality of recessed portions, respectively, wherein:

the first plate comprises a plurality of grooves formed in a lateral side of the first plate;

each of the plurality of recessed portions is positioned in each of the plurality of grooves of the first plate;

the recessed portion is shaped to define a hole facing the second plate; and the wheel assembly comprises a wheel plate positioned in the hole of the recessed portion and coupled to the second plate.

12. The display device of claim 11, further comprising a substrate positioned in the internal space of the case, wherein the third plate covers the substrate.

13. The display device of claim 12, further comprising a middle plate positioned between the first plate and the second plate, wherein the middle plate is shaped to define a hole positioned corresponding to the substrate.

14. The display device of claim 13, wherein the middle plate comprises a plurality of grooves formed in a lateral side of the middle plate, and wherein each of the plurality of recessed portions is positioned in each of the plurality of grooves of the middle plate.

* * * * *